(12) United States Patent
Kamimuta et al.

(10) Patent No.: US 7,834,408 B2
(45) Date of Patent: Nov. 16, 2010

(54) SEMICONDUCTOR DEVICE AND METHOD FOR MANUFACTURING THE SAME

(75) Inventors: Yuuichi Kamimuta, Yokohama (JP); Akira Nishiyama, Yokohama (JP); Yasushi Nakasaki, Yokohama (JP); Tsunehiro Ino, Fujisawa (JP); Masato Koyama, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/320,279

(22) Filed: Jan. 22, 2009

(65) Prior Publication Data
US 2009/0166767 A1 Jul. 2, 2009

Related U.S. Application Data

(62) Division of application No. 11/373,140, filed on Mar. 13, 2006, now Pat. No. 7,498,643.

(30) Foreign Application Priority Data
Aug. 11, 2005 (JP) .............................. 2005-232979

(51) Int. Cl.
*H01L 29/76* (2006.01)
(52) U.S. Cl. ........................ 257/411; 257/410; 257/405; 257/406
(58) Field of Classification Search ................ 257/411
See application file for complete search history.

(56) References Cited
U.S. PATENT DOCUMENTS
4,950,620 A 8/1990 Harrington, III

| | | | |
|---|---|---|---|
| 6,563,182 B2 * | 5/2003 | Horikawa | 257/405 |
| 6,875,662 B2 * | 4/2005 | Iwasaki et al. | 438/287 |
| 2005/0247985 A1 | 11/2005 | Watanabe et al. | |
| 2006/0252193 A1 | 11/2006 | Rabkin et al. | |

FOREIGN PATENT DOCUMENTS

| | | |
|---|---|---|
| JP | 2002-280461 | 9/2002 |
| JP | 2004-031760 | 1/2004 |
| JP | 2004-103737 | 4/2004 |

OTHER PUBLICATIONS

Machine translation of JP 2002-280461, printed Sep. 20, 2009.
Notification of Reasons for Rejection issued by the Japanese Patent Office on Jul. 13, 2010, for Japanese Patent Application No. 2005-232979, and English-language translation thereof.

* cited by examiner

*Primary Examiner*—Bradley K Smith
*Assistant Examiner*—Tony Tran
(74) *Attorney, Agent, or Firm*—Finnegan, Henderson, Farabow, Garrett & Dunner, L.L.P.

(57) ABSTRACT

It is possible to prevent the deterioration of device characteristic as much as possible. A semiconductor device includes: a semiconductor substrate; a gate insulating film provided above the semiconductor substrate and containing a metal, oxygen and an additive element; a gate electrode provided above the gate insulating film; and source/drain regions provided in the semiconductor substrate on both sides of the gate electrode. The additive element is at least one element selected from elements of Group 5, 6, 15, and 16 at a concentration of 0.003 atomic % or more but 3 atomic % or less.

6 Claims, 20 Drawing Sheets

_US 7,834,408 B2_

SEMICONDUCTOR DEVICE AND METHOD FOR MANUFACTURING THE SAME

CROSS-REFERENCE TO RELATED APPLICATION

This is a division of application Ser. No. 11/373,140, filed Mar. 13, 2006 now U.S. Pat. No. 7,498,643, which is incorporated herein by reference.

This application is based upon and claims the benefit of priority from prior Japanese Patent Application No. 2005-232979 filed on Aug. 11, 2005 in Japan, the entire contents of which are incorporated herein by reference.

BACKGROUND OF THE INVENTION

1. Field of the Invention

The present invention relates to a semiconductor device and a method for manufacturing the same.

2. Related Art

In MOS transistors, an increase in leakage current between a gate and a substrate resulting from direct tunneling of carriers through an insulating film is an issue. As a method for avoiding such tunneling, formation of a gate insulating film using a material having a relative dielectric constant significantly higher than that of $SiO_2$ has been proposed. Specific examples of such a gate insulating film include metal oxide films made of high-dielectric constant metal oxides such as $ZrO_2$ and $HfO_2$ and metal oxide films made of compounds of such high-dielectric constant metal oxides and $SiO_2$, i.e., so-called silicates. Further, silicates containing nitrogen can maintain an amorphous state even at 1,000° C., and have a high relative dielectric constant of about 20. In addition, the diffusion coefficient of an impurity such as boron in such N-containing silicate films is small. For these reasons, N-containing silicate films are expected to be applied to a CMOS process requiring heat resistance.

However, in a case where a gate electrode made of polycrystalline silicon and a gate insulating film made of a metal oxide such as $HfO_2$ or $ZrO_2$ are used together, a threshold voltage fluctuates. The degree of fluctuation is very large, and therefore it is difficult to control a threshold voltage by a conventional method, that is, by adjusting the impurity concentration of a substrate portion. Further, it has been confirmed that such a phenomenon can occur not only when pure semiconductor gate electrodes of, for example, Si or Ge are used, but also when semiconductor gate electrodes of metal silicides or metal germanides are used.

In order to solve such a problem, a method for suppressing fluctuations in threshold voltage has been proposed (see, for example, Japanese Patent Laid-open Publication No. 2002-280461). According to this method, an additive element having a valence higher than that of a metal constituting a high-dielectric constant film by one is added to an N-MIS transistor and an additive element having a valence lower than that of a metal constituting a high-dielectric constant film by one is added to a P-MIS transistor so that charge states thereof are different from each other, thereby suppressing fluctuations in threshold voltage.

However, addition of different additive elements to the N-MIS transistor and the P-MIS transistor complicates a manufacturing process, thereby increasing manufacturing costs as a whole.

Further, in order to achieve a low threshold voltage, it is necessary to add a high concentration (10 atomic %) of additive element. When the concentration of the additive element is high, it is impossible to neglect the characteristics of the additive element itself. For example, excessive addition of the additive element leads to a decrease in dielectric constant. Further, excessive addition of the additive element allows a large number of fixed charges to exist in the insulating film so that electrons or holes as transistor carriers are scattered by the fixed charges existing in the insulating film, thus resulting in decrease in electron mobility or hole mobility. As described above, introduction of a high concentration of additive element into a gate insulating film made of a metal oxide leads to a decrease in dielectric constant and a decrease in electron mobility or hole mobility, thereby causing a problem that device characteristics are deteriorated.

SUMMARY OF THE INVENTION

Under the circumstances, it is an object of the present invention to provide a semiconductor device capable of preventing deterioration of device characteristics as much as possible and a method for manufacturing such a semiconductor device.

A semiconductor device according to a first aspect of the present invention includes: a semiconductor substrate; a gate insulating film provided above the semiconductor substrate and containing a metal, oxygen and an additive element; a gate electrode provided above the gate insulating film; and source/drain regions provided in the semiconductor substrate on both sides of the gate electrode, the additive element being at least one element selected from elements of Group 5, 6, 15, and 16 at a concentration of 0.003 atomic % or more but 3 atomic % or less.

A semiconductor device according to a second aspect of the present invention includes: a semiconductor substrate; a gate insulating film provided above the semiconductor substrate; a first gate electrode provided above the gate insulating film; an interelectrode insulating film provided above the first gate electrode and containing a metal, oxygen and an additive element; a second gate electrode provided above the interelectrode insulating film; and source/drain regions provided in the semiconductor substrate on both sides of the first and second gate electrodes, the additive element being at least one element selected from elements of Group 5, 6, 15, and 16 at a concentration of 0.003 atomic % or more but 3 atomic % or less.

A method for manufacturing a semiconductor device according to a third aspect of the present invention includes: forming a gate insulating film which contains a metal, oxygen, and 0.003 atomic % or more but 3 atomic % or less of at least one additive element selected from elements of Group 5, 6, 15, and 16, above a semiconductor substrate; forming a gate electrode above the gate insulating film; and forming source/drain regions by introducing an impurity into an element region of the semiconductor substrate by using the gate electrode as a mask.

DETAILED DESCRIPTION OF THE INVENTION

Hereinbelow, embodiments of the present invention will be described with reference to the accompanying drawings.

First Embodiment

A semiconductor device according to a first embodiment of the present invention includes a MIS transistor comprising a gate insulating film made of a high-dielectric constant dielectric and provided on a semiconductor substrate, a gate electrode provided on the gate insulating film, and source/drain regions provided in the semiconductor substrate on both sides of the gate electrode. The gate insulating film contains not only a metal and oxygen but also at least one element selected from elements of Group 5, 6, 15, and 16 at a concentration of 3 atomic % or less as an additive element. Hereinbelow, a gate insulating film containing hafnium (Hf) as a metal and antimony (Sb) as an additive element will be described by way of example.

Figure 1:
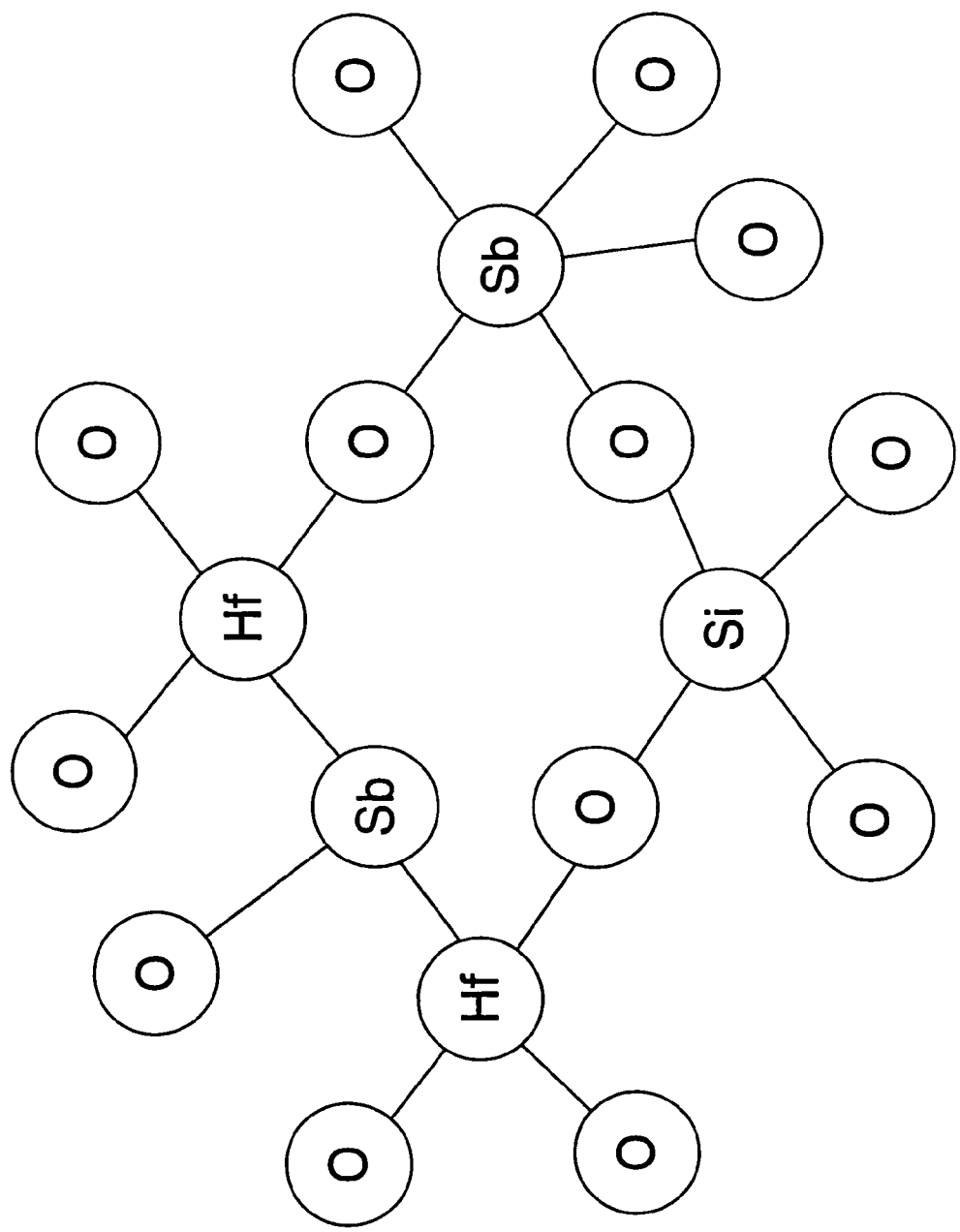
FIG. 1 is a schematic view which shows the bonding state of a metal, oxygen, and an additive element in a metal oxide film constituting a gate insulating film of a semiconductor device according to a first embodiment of the present invention.

As schematically shown in FIG. 1, the metal and oxygen constituting the gate insulating film of the semiconductor device according to the first embodiment are bonded together to form a metal oxide in the gate insulating film. Further, as shown in FIG. 1, Hf and oxygen are partially replaced with Sb added as the additive element so that Sb is contained in the gate insulating film.

In the metal oxide used as a high-dielectric constant dielectric, a large amount of oxygen vacancies are formed not only just after the formation of the gate insulating film but also in the step of forming the gate electrode made of a semiconductor or the step of heat treatment for activation. The amount of oxygen vacancies to be formed varies depending on conditions for forming the gate insulating film, conditions for forming the gate electrode made of a semiconductor, or heat treatment conditions for activation, but can reach 0.1 atomic %. However, the addition of Sb as the additive element makes it possible to suppress the removal of oxygen from the gate insulating film. As shown in FIG. 1, both of Hf and oxygen can be replaced with Sb added as the additive element. In either case, Sb added to the gate insulating film is tightly bonded to oxygen contained in the gate insulating film to stabilize oxygen, thereby suppressing the removal of oxygen from the gate insulating film.

Figure 2:
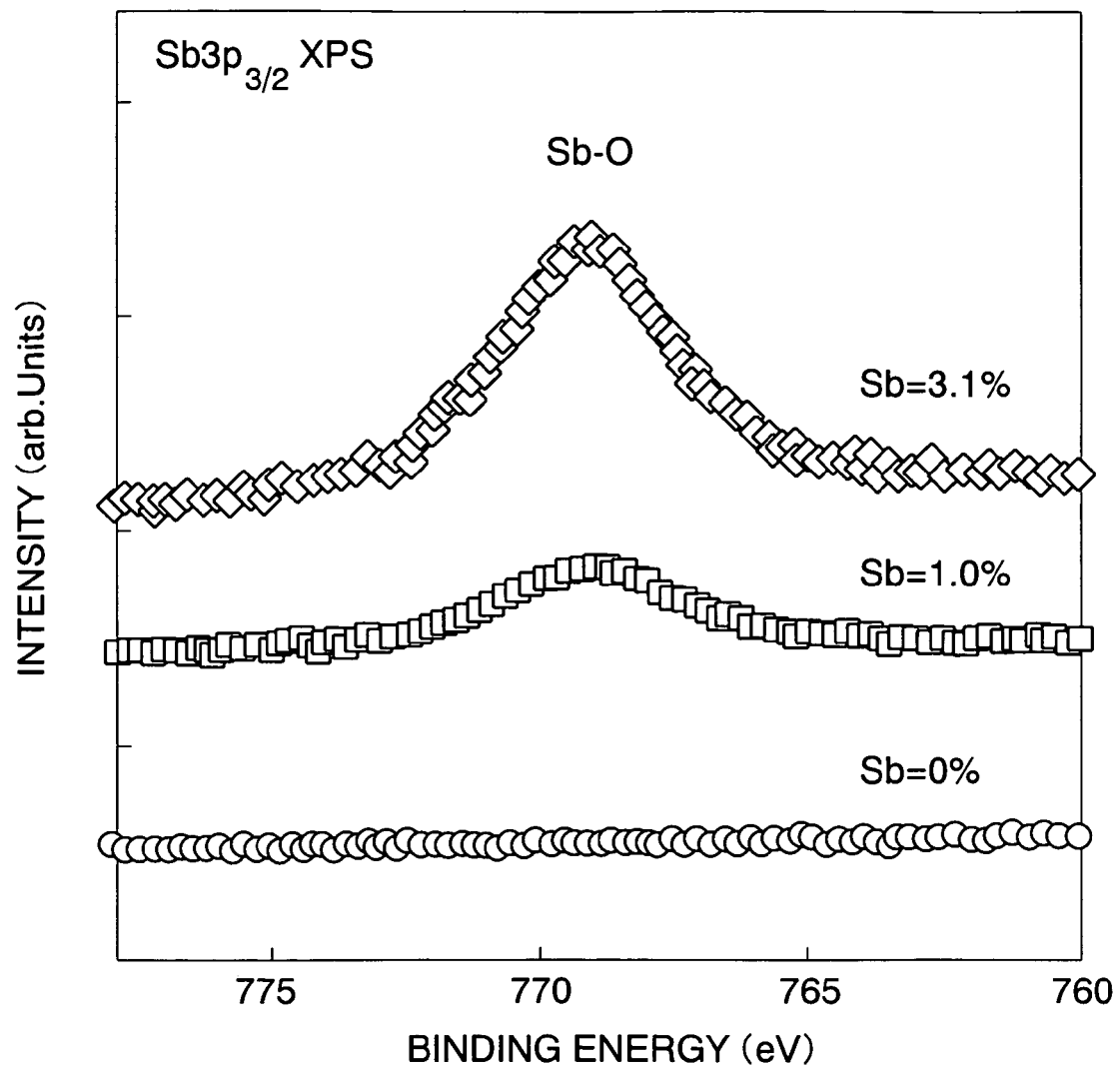
FIG. 2 shows an XPS spectrum representing the bonding state of Sb added to the gate insulating film of the semiconductor device according to the first embodiment of the present invention and an XPS spectrum representing the bonding state of Sb added to a gate insulating film of a semiconductor device according to a comparative example.

FIG. 2 shows an XPS (X-ray Photoelectron Spectroscopy) spectrum representing the bonding state of Sb added to the gate insulating film of the semiconductor device according to the first embodiment and an XPS spectrum representing the bonding state of Sb added to a gate insulting film of a semiconductor device according to a comparative example. The concentration of Sb added to the gate insulating film of the semiconductor device according to the first embodiment is about 1.0 atomic %, and the concentration of Sb added to the gate insulating film of the semiconductor device according to the comparative example is about 3.1 atomic %. As can be seen from FIG. 2, in both of the semiconductor devices according to the first embodiment and the comparative example, Sb is mainly bonded to oxygen, that is, Hf is mainly replaced with Sb so that Sb is contained in the gate insulating film. In FIG. 2, an Hf—Sb bond is not detected, because the amount of oxygen vacancies is 0.1 atomic % at most and therefore the amount of Hf—Sb bonds is less than an amount detectable by XPS. The bonding state of such a trace amount of element can be evaluated by EELS (Electron Energy Loss Spectroscopy). EELS is an analytical method excellent in analysis of elements having a relatively low atomic number.

Therefore, EELS is preferably used for evaluation of phosphorus, arsenic, antimony, bismuth and the like.

In a case where Sb is excessively added, there is a fear that a decrease in dielectric constant causes an increase in leakage current. Since the dielectric constant of $HfO_2$ is about 20 and the dielectric constant of $Sb_2O_3$ is about 8, there is a possibility that excessive addition of Sb causes an increase in leakage current due to a decrease in dielectric constant.

Figure 3:
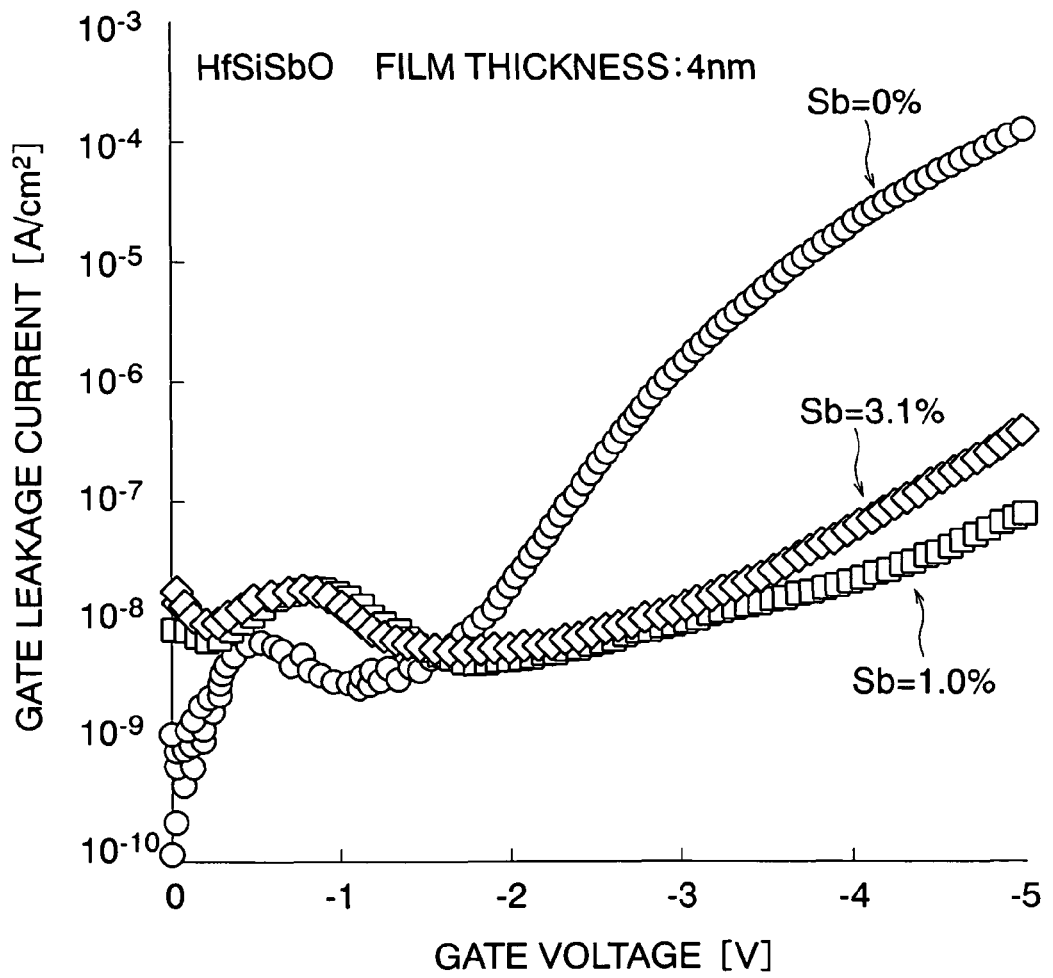
FIG. 3 is a graph which shows the gate leakage current characteristics of the semiconductor device according to the first embodiment of the present invention and the gate leakage current characteristics of semiconductor devices according to comparative examples 1 and 2.

FIG. 3 shows the difference in gate leakage current among semiconductor devices according to the first embodiment and comparative examples 1 and 2 containing Sb at different concentrations. In the case of the semiconductor device according to the first embodiment containing Sb at 1.0 atomic %, gate leakage current is significantly decreased as compared to the case of the semiconductor device according to the comparative example 1 not containing Sb. This is because, in this case, addition of Sb has the effect of compensating for oxygen vacancy sites in the high-dielectric constant insulating film rather than decreasing the dielectric constant of the insulating film so that electron and hole trapping sites are decreased. On the other hand, in the case of the semiconductor device according to the comparative example 2 containing Sb at 3.1 atomic %, gate leakage current is slightly increased as compared to the case of the semiconductor device according to the first embodiment containing Sb at 1.0 atomic %. As a reason for this, it can be considered that, as described above, excessive addition of Sb decreases dielectric constant, thereby increasing leakage current.

Figure 4:
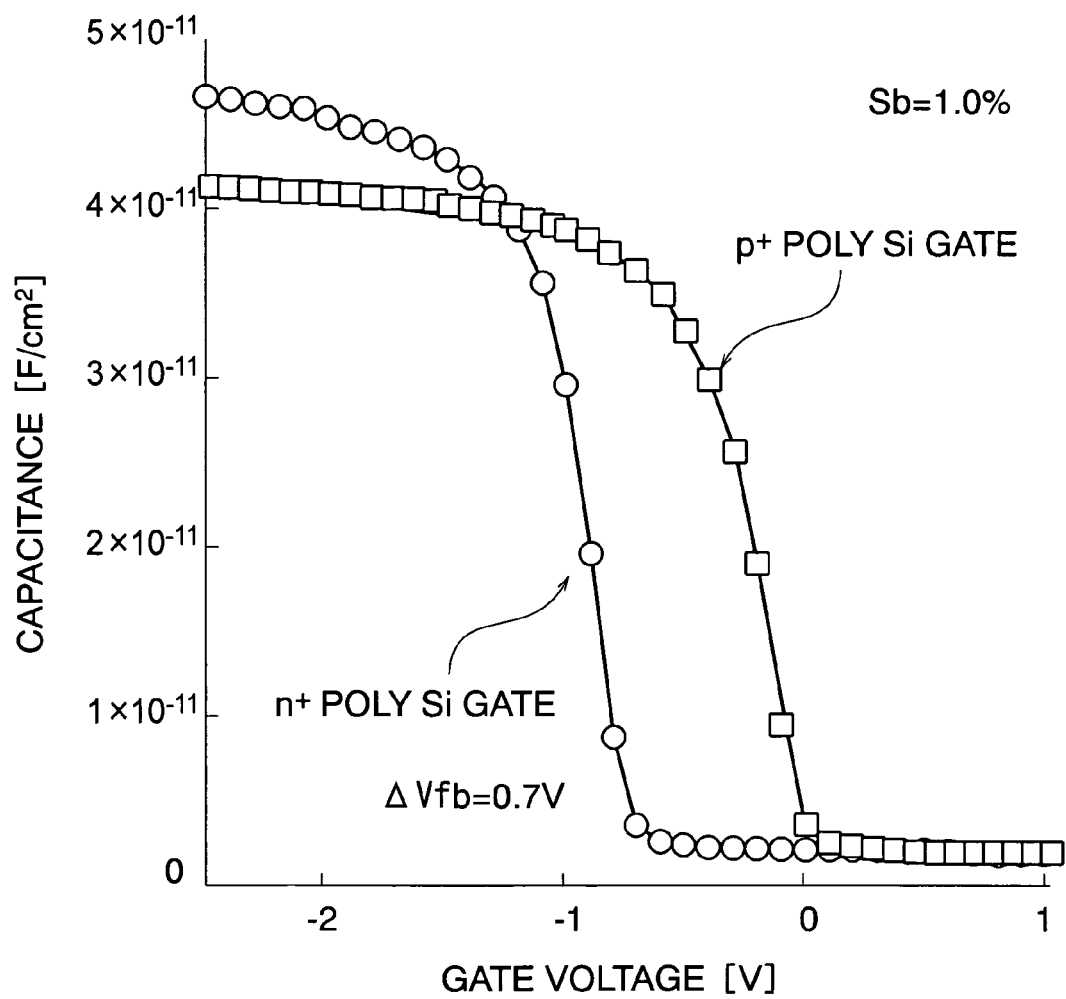
FIG. 4 is a graph which shows the capacitance-voltage characteristics of semiconductor devices according to the first embodiment of the present invention.

FIG. 4 shows the capacitance-voltage characteristics of N- and P-type silicon gate-MOS capacitors containing Sb at the same concentration as the semiconductor device according to the first embodiment, that is, at 1.0 atomic %. As shown in FIG. 4, the difference in flat-band voltage between the N- and P-type silicon gate-MOS capacitors containing Sb at the same concentration as the semiconductor device according to the first embodiment, that is, at 1.0 atomic % is about 0.7 V. Therefore, it is possible to adjust a threshold voltage by ion implantation into a channel region, thereby suppressing fluctuations in flat-band voltage to an acceptable level for a MISFET for practical use. As a result, it is possible to obtain a semiconductor device including a MIS transistor which can normally operate.

Figure 5:
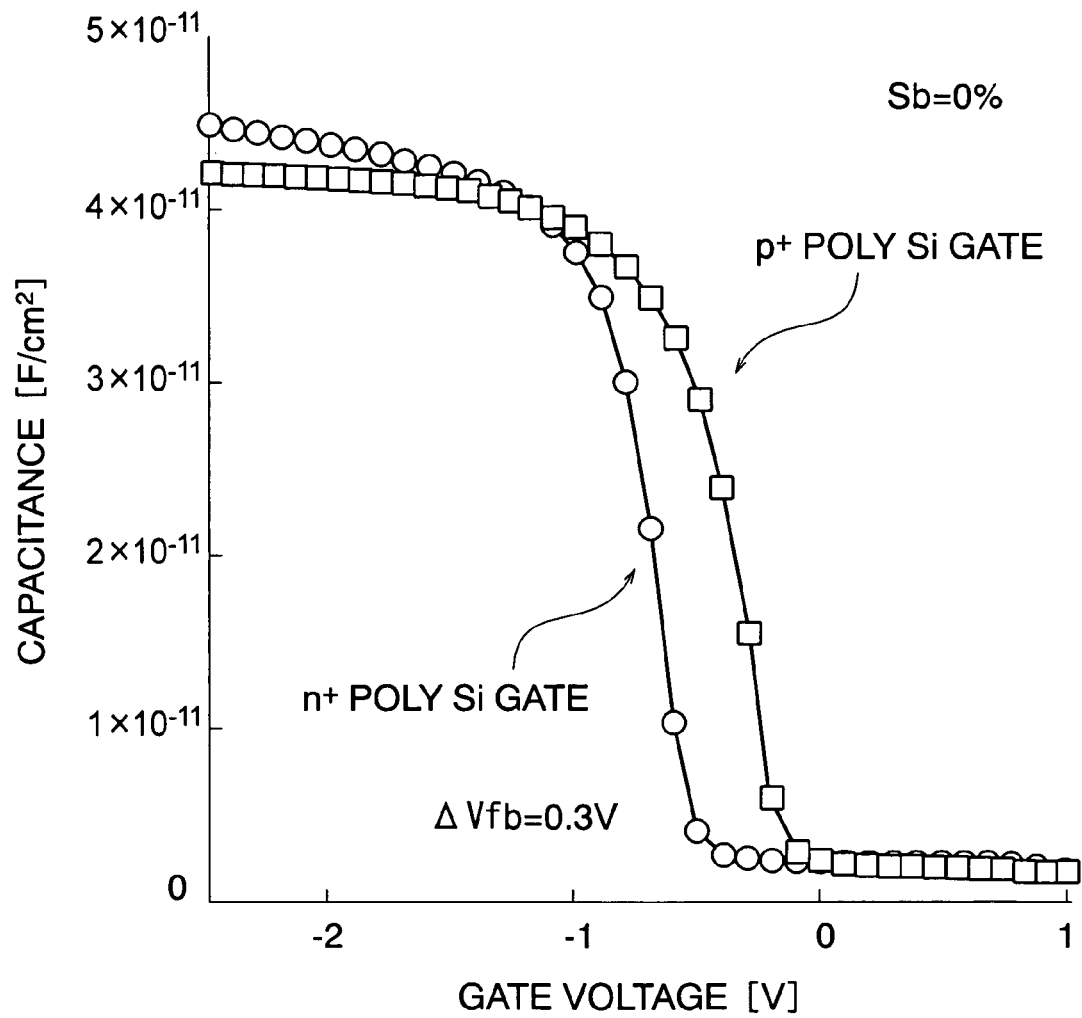
FIG. 5 is a graph which shows the capacitance-voltage characteristics of conventional semiconductor devices.

On the other hand, in the case of a conventional example containing no Sb (Sb=0%) as shown in FIG. 5, the difference in flat-band voltage between N-type and P-type silicon gate-MOS capacitors is only about 0.3 V. In this case, it is difficult to adjust a threshold voltage by ion implantation into a channel region. Therefore, such semiconductor devices cannot be used as MISFETs.

Figure 6:
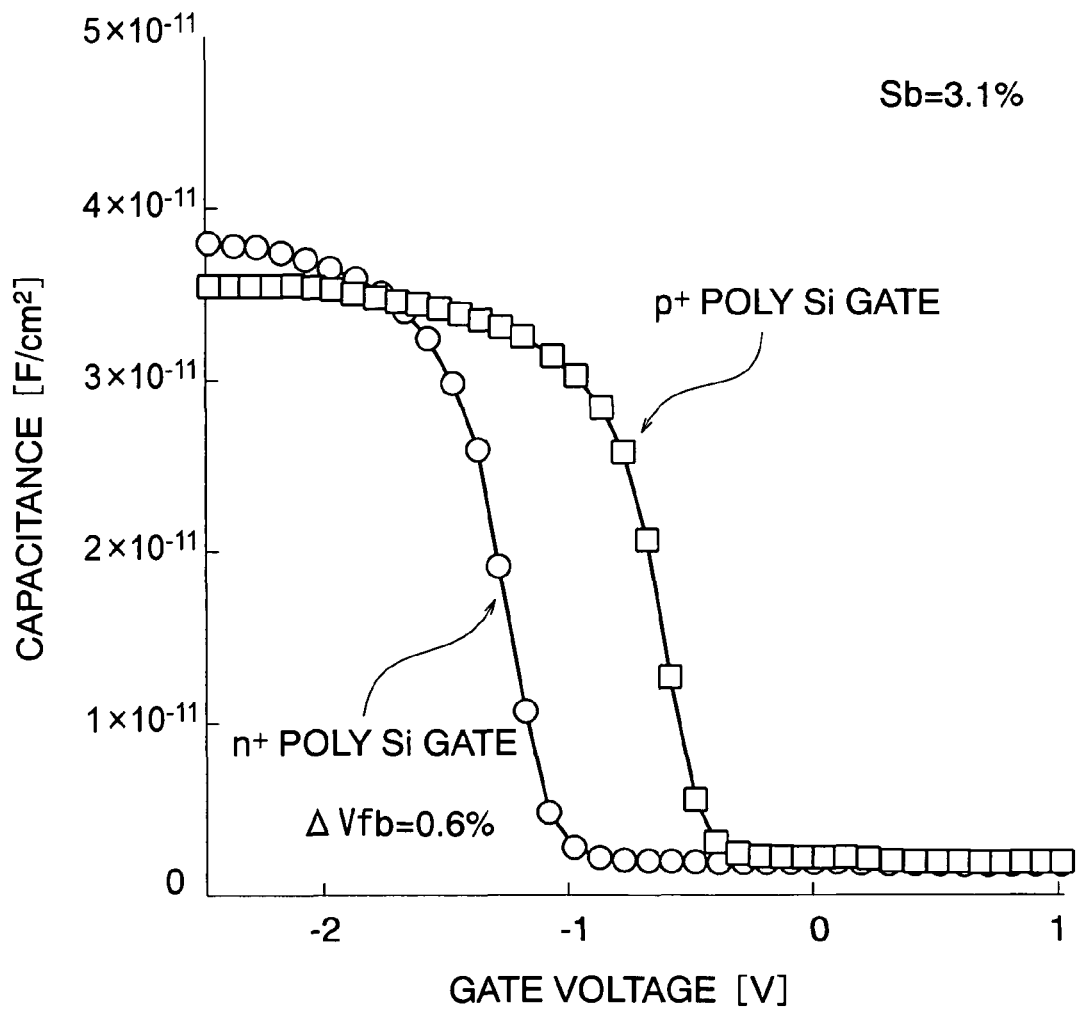
FIG. 6 is a graph which shows the capacitance-voltage characteristics of semiconductor devices according to a comparative example.

In the case of a comparative example containing Sb at 3.1 atomic % as shown in FIG. 6, the difference in flat band voltage between N- and P-type silicon gate-MOS capacitors is enough, that is, 0.6 V. However, in this case, the capacitance of each of the MOS capacitors is decreased due to a decrease in dielectric constant, and the flat-band voltage of each of the MOS capacitors negatively shifts due to an increase in fixed charge generated by Sb itself.

According to the above description and the findings of the present inventors, the amount of the additive element is preferably 0.003 atomic % or more but 3 atomic % or less. By decreasing the amount of the additive element to 3 atomic % or less, it is possible to suppress a decrease in electron mobility or hole mobility due to scattering of electrons or holes, caused by an increase in fixed charge, to a negligible level.

As has been described above, according to the first embodiment, it is possible to prevent the deterioration of device characteristics as much as possible and to avoid fluctuations in threshold voltage.

Further, according to the first embodiment, it is also possible to add the same additive element to the N- and P-MIS transistors, and therefore a manufacturing process is simplified, thereby suppressing an increase in manufacturing costs.

Second Embodiment

Figure 7:
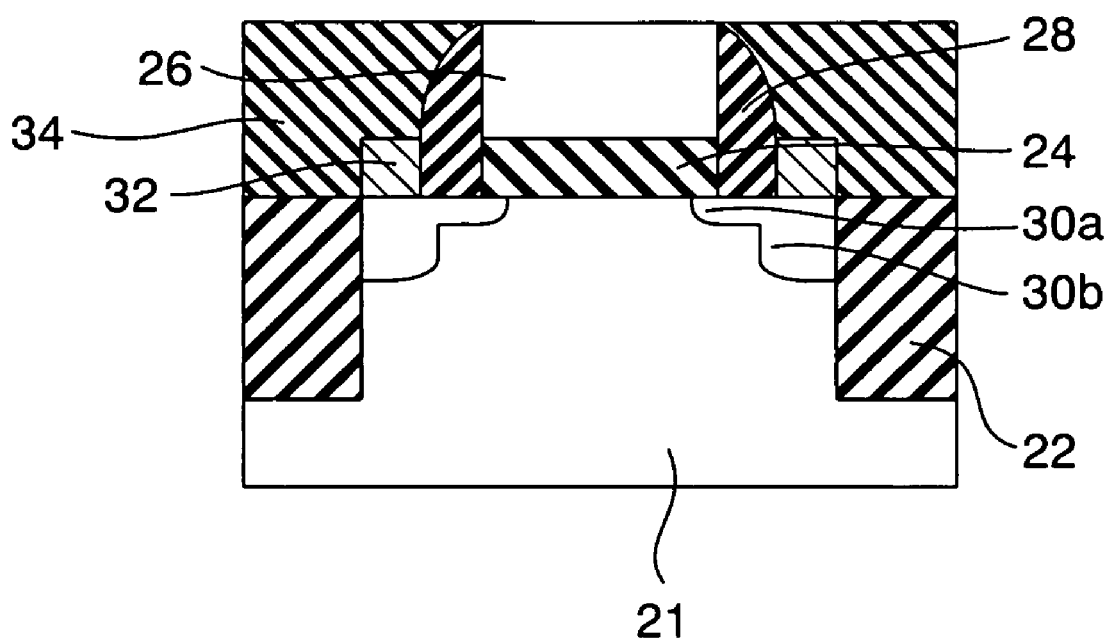
FIG. 7 is a cross-sectional view of a semiconductor device according to a second embodiment of the present invention.

Hereinbelow, a semiconductor device according to a second embodiment of the present invention will be described with reference to FIG. 7. FIG. 7 is a cross-sectional view of the semiconductor device according to the second embodiment. The semiconductor device according to the second embodiment includes a MIS transistor, and a gate insulating film of the MIS transistor has the same structure as the gate insulating film of the semiconductor device according to the first embodiment. As shown in FIG. 7, a silicon oxide film 22 is provided on a p-type silicon substrate 21 for element isolation. In the surface of the silicon substrate 21, shallow diffusion layers 30a and deep diffusion layers 30b are provided as n-type source and drain by arsenic ion implantation. On the surface of the silicon substrate 21, a gate insulating film 24 made of HfSiSbOx is provided. Further, on the gate insulating film 24, a gate electrode 26 made of polycrystalline silicon is provided. On the side faces of the gate electrode 26, a side wall 28 formed from, for example, a silicon oxide film is provided. On each of the deep diffusion layers 30b of the source/drain, a NiSi layer 32 is provided. The MIS transistor according to the second embodiment having such a structure described above is covered with an interlayer insulating film 34.

Next, the manufacturing steps of the semiconductor device according to the second embodiment will be described with reference to FIGS. 8A to 10C. FIGS. 8A to 10C are cross-sectional views which show the manufacturing steps of the semiconductor device according to the second embodiment.

First, an element isolation region 22 is formed on the semiconductor substrate 21. Here, as the semiconductor substrate 21, a p-type silicon substrate is used, and the element isolation region 22 is formed by a well-known method. Specifically, an STI (Shallow Trench Isolation) trench (having a depth of, for example, about 0.4 μm) is formed in the substrate 21, and then an silicon oxide film is deposited on the entire surface of the substrate 21 by a CVD (Chemical Vapor Deposition) method to fill the trench with the silicon oxide film. Thereafter, the substrate 21 is subjected to CMP (Chemo-Mechanical Polish) to obtain an element isolation region 22 shown in FIG. 8A.

Figure 8A:
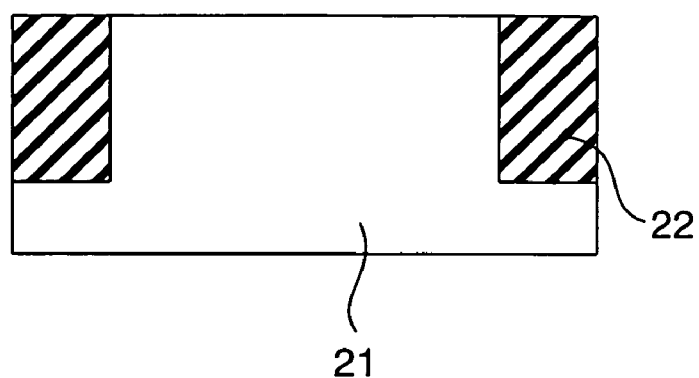
FIGS. 8A to 8C are cross-sectional views which show the manufacturing steps of the semiconductor device according to the second embodiment of the present invention.
Figure 8B:
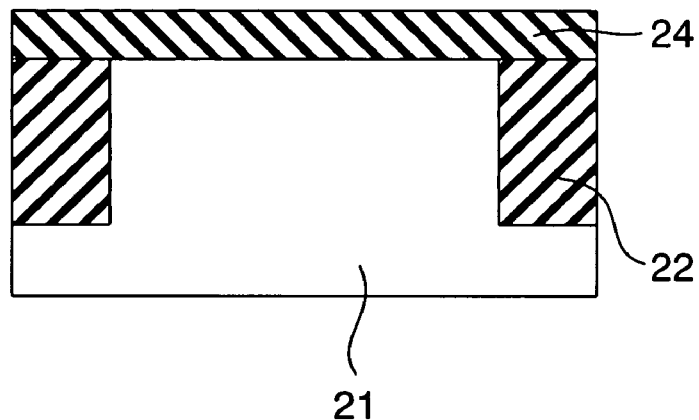

Next, boron (B) ions are implanted into an element region for threshold voltage adjustment. Thereafter, as shown in FIG. 8B, an insulating film 24 of HfSiSbOx is formed by a sputtering method. In this case, three targets, a hafnium target, a silicon target, and a antimony target to be added as an impurity are used, and the ratio of Hf to the sum of Hf and Si (Hf/(Hf+Si)) in the insulating film 24 and the amount of Sb to be contained as an impurity in the insulating film 24 are controlled by adjusting the ratio of power applied to these targets. In the second embodiment, the ratio, Hf/(Hf+Si) is set to 0.5, but can be set to any value within the range of 0.3 to 1.0. Further, the amount of Sb is set to 1.0 atomic %. However, as described above with reference to the first embodiment, the amount of Sb can be set to any value within the range of 0.003 to 3 atomic %. It is to be noted that the amount of Sb added as an impurity was evaluated by XPS. The insulating film 24 may be an oxynitride film or a nitride film obtained by controlling the amounts of nitrogen and oxygen to be mixed into an atmosphere for sputtering so that the dielectric film can contain nitrogen. In the second embodiment, the temperature of the substrate at the time when the insulating film 24 is formed is set to room temperature, but can be set to any value. Further, in the second embodiment, the thickness of the insulating film 24 is set to 4 nm, but can be appropriately set to a value within the range of 2 to 5 nm.

Figure 8C:
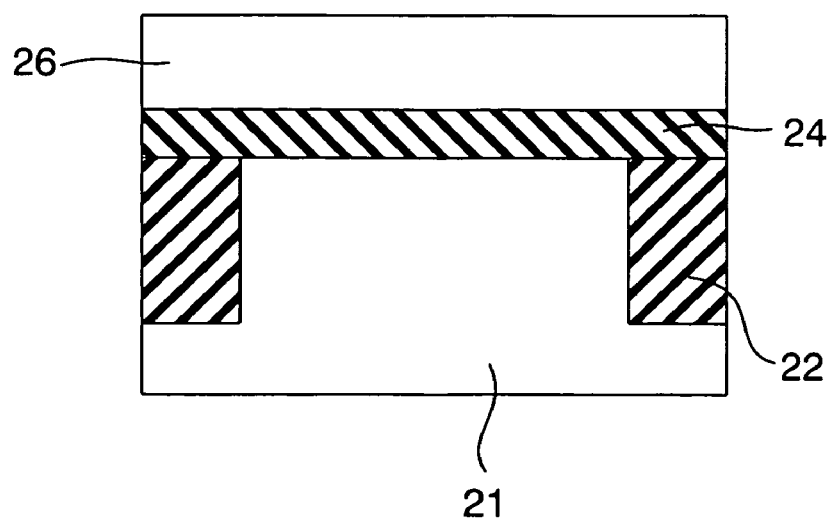

Next, as shown in FIG. 8C, a polycrystalline silicon film for forming the gate electrode 26 is deposited on the gate insulating film 24 by a CVD method in an atmosphere containing $Si_2H_6$ gas or $SiH_4$ gas.

Figure 9A:
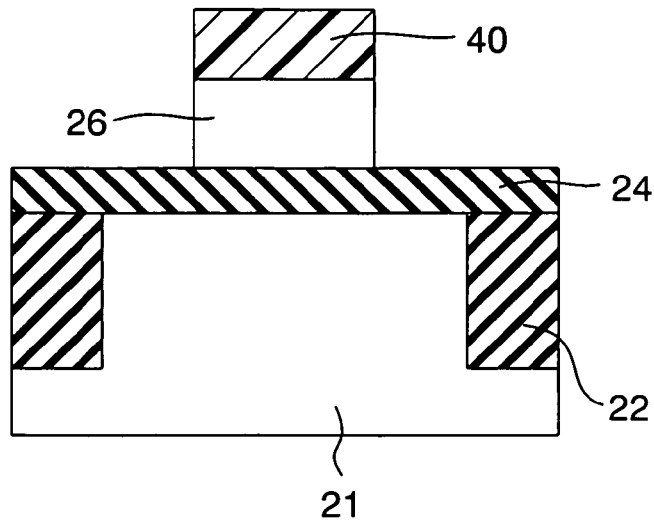
FIGS. 9A to 9C are cross-sectional views which show the manufacturing steps of the semiconductor device according to the second embodiment of the present invention.
Figure 9B:
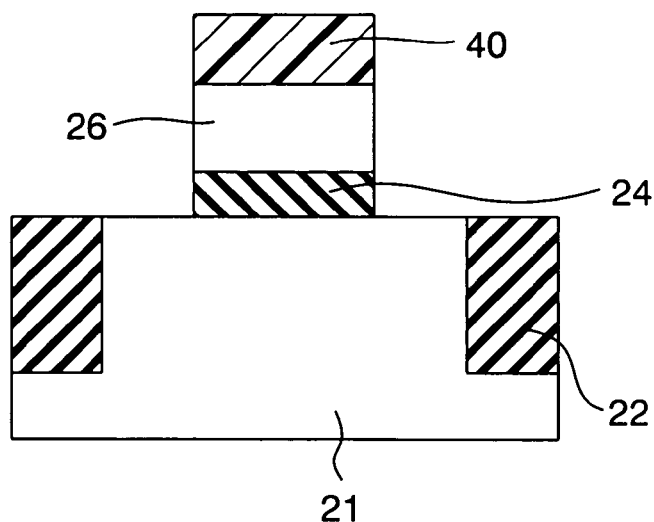

Next, a resist pattern 40 is formed on the polycrystalline silicon film, and then the polycrystalline silicon film is patterned using the resist pattern 40 as a mask by reactive ion etching using CFx gas to thereby form the gate electrode 26 shown in FIG. 9A. Then, in a state where the resist pattern 40 remains on the gate electrode 26, the insulating film 24 is etched using an aqueous hydrofluoric acid solution to form the gate insulting film 24 shown in FIG. 9B. As a result, the surface of the substrate 21 is exposed on both sides of the gate insulating film 24.

Figure 9C:
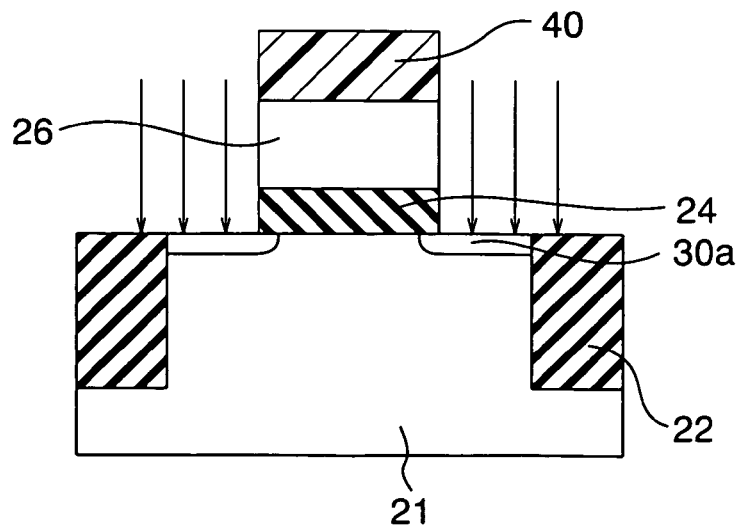

Thereafter, as shown in FIG. 9C, arsenic (As) ions are implanted into the exposed substrate 21 to form shallow impurity regions 30a. At this time, ion implantation is carried out at an accelerating voltage of 200 eV and a dosage of about $1 \times 10^{15}$ cm$^{-2}$.

Figure 10A:
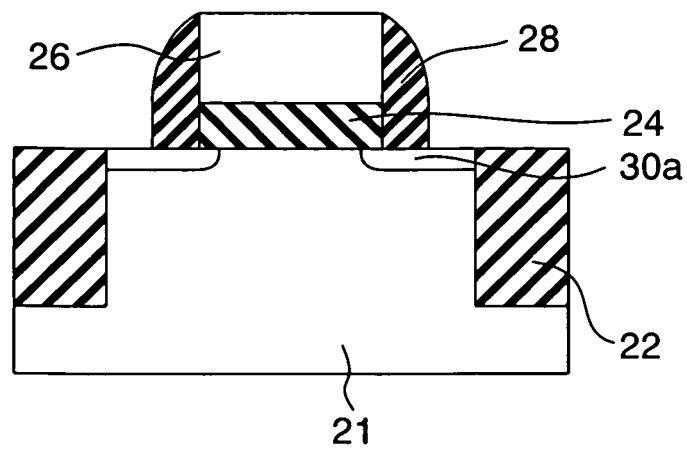
FIGS. 10A to 10C are cross-sectional views which show the manufacturing steps of the semiconductor device according to the second embodiment of the present invention.

Next, the resist pattern 40 is removed. Thereafter, $SiO_2$ or SiN is deposited on the entire surface by, for example, a CVD method, and then overall etching is carried out by anisotropic etching so that the gate side wall 28 having a thickness of 10 nm is formed on the side faces of the gate electrode 26 as shown in FIG. 10A.

Figure 10B:
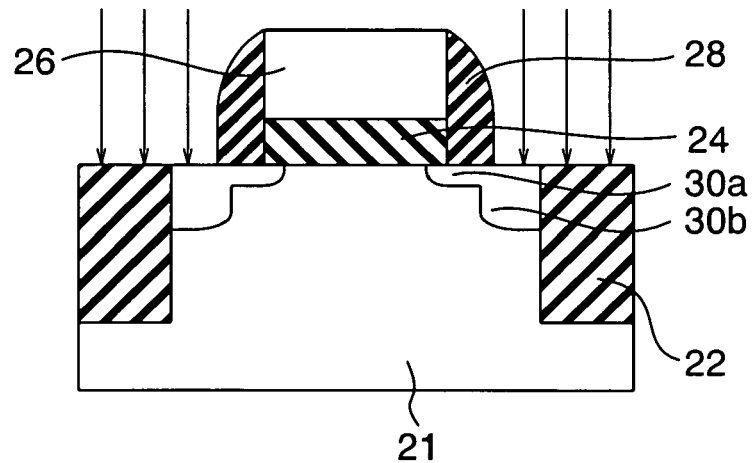

Arsenic ions are implanted into the substrate 21 by the use of the gate side wall 28 and the gate electrode 26 as a mask under the conditions of, for example, an accelerating voltage of 10 keV and a dosage of $1 \times 10^{15}$ cm$^{-2}$ to thereby form deep impurity regions 30b as shown in FIG. 10B. Then, heat treatment is carried out at a temperature of 600° C. or higher for activation of the impurity to thereby form extension layers 30a and source/drain regions 30b. Activation of the impurity is preferably carried out at a high temperature of about 1,000° C. for a short time of about 10 seconds.

Figure 10C:
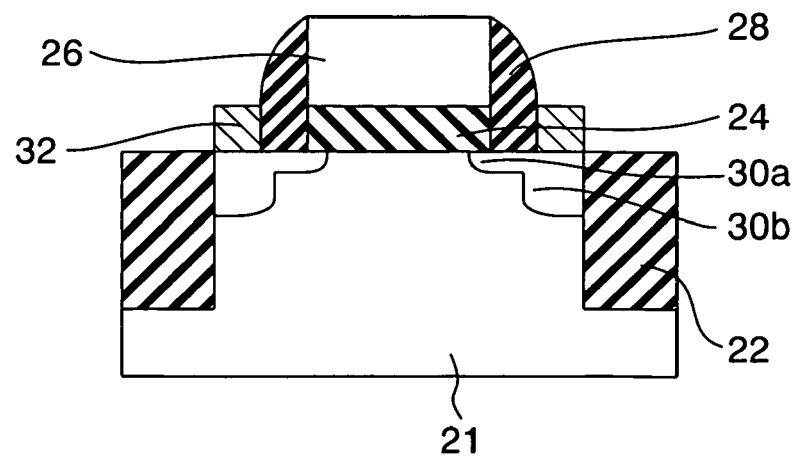

Next, a Ni film is formed on the entire surface, and then heat treatment is carried out at a temperature of about 400° C. to react exposed silicon with Ni. Then, unreacted Ni is removed by etching using a mixed solution of sulfuric acid and hydrogen peroxide. As a result, as shown in FIG. 10C, the Ni silicide (NiSi) layer 32 is formed on each of the source/drain regions 30b. At this time, although not shown in the drawing, the Ni silicide layer is formed also on the upper surface of the gate electrode 26 made of polycrystalline silicon. Thereafter, a silicon oxide film is deposited on the entire surface by a CVD method to form the interlayer insulating film 34 shown in FIG. 7.

Although subsequent steps are not shown in drawings, according to a well-known method, it is possible to obtain a MOS structure with a first layer wiring. For example, contact holes are formed in the interlayer insulating film 34 to expose the surface of the NiSi layer 32, and then TiN as a barrier metal is deposited on the bottom surfaces of the contact holes by CVD. Thereafter, W as a plug material is deposited on the entire surface to fill the contact holes with W, and then the entire surface is planarized by CMP. Then, an Al—Cu film as a wiring material is deposited, and the Al—Cu film is patterned by photolithography to thereby obtain a MOS structure with a first layer wiring.

As in the case of the first embodiment, the second embodiment of the present invention can also provide a semiconductor device capable of preventing the deterioration of device characteristics as much as possible and avoiding fluctuations in threshold voltage.

Further, as in the case of the first embodiment, it is possible to add the same additive element to the N- and P-type MIS transistors, and therefore a manufacturing process is simplified, thereby suppressing an increase in manufacturing costs.

Third Embodiment

Figure 11:
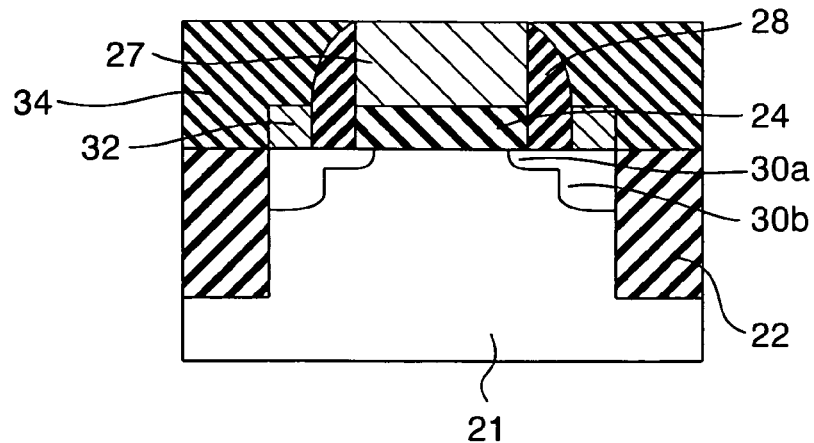
FIG. 11 is a cross-sectional view of a semiconductor device according to a third embodiment of the present invention.

Hereinbelow, a semiconductor device according to a third embodiment of the present invention will be described with reference to FIG. 11. FIG. 11 is a cross-sectional view of the semiconductor device according to the third embodiment. The semiconductor device according to the third embodiment has the same structure as the semiconductor device according to the second embodiment shown in FIG. 7 except that the gate electrode 26 made of polysilicon is replaced with a gate electrode 27 made of a metal semiconductor compound, e.g., Ni silicide (NiSi).

Figure 12:
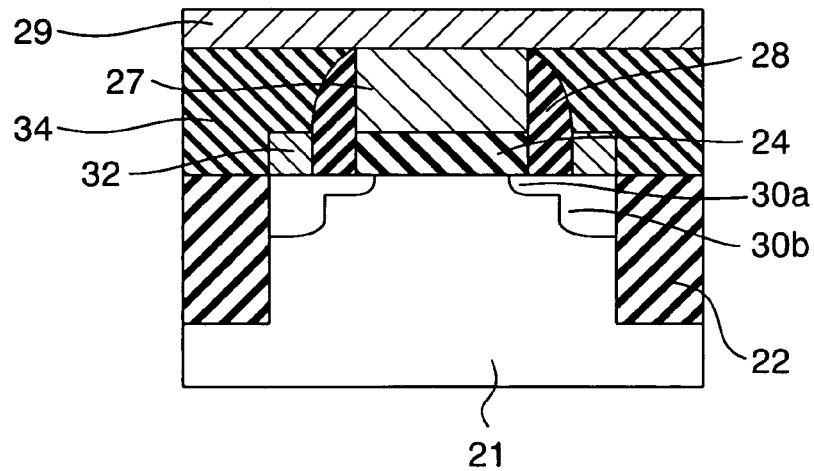
FIG. 12 is a cross-sectional view which shows the manufacturing step of the semiconductor device according to the third embodiment of the present invention.

Next, the manufacturing steps of the semiconductor device according to the third embodiment will be described with reference to FIG. 12. FIG. 12 is a cross-sectional view which shows the manufacturing step of the semiconductor device according to the third embodiment.

The semiconductor device according to the third embodiment is manufactured in the same manner as in the second embodiment until the interlayer insulating film 34 is formed. Thereafter, as shown in FIG. 12, a Ni film 29 is deposited on the entire surface, and is then subjected to heat treatment at a temperature of about 400° C. so that all the silicon atoms of the polycrystalline silicon film 26 react with Ni to form Ni silicide. As described above, since heat treatment is carried out at a low temperature of about 400° C., the profiles of the extension layers 30a and source/drain regions 30b are not changed. Into the polycrystalline silicon film 26, phosphorus (P), arsenic (As), antimony (Sb) or boron (B) may be previously introduced. After the completion of the reaction, unreacted Ni is removed using a mixed solution of sulfuric acid and hydrogen peroxide to thereby form the gate electrode 27 of NiSi shown in FIG. 11.

Although subsequent steps are not shown in drawings, according to a well-known method, it is possible to obtain a MOS structure with a first layer wiring. For example, contact holes are formed in the interlayer insulating film 34 to expose the surface of the NiSi layer 32, and then TiN as a barrier metal is deposited on the bottom surfaces of the contact holes by CVD. Thereafter, W as a plug material is deposited on the entire surface to fill the contact holes with W, and then the entire surface is planarized by CMP. Then, an Al—Cu film as a wiring material is deposited, and the Al—Cu film is patterned by photolithography to thereby obtain a MOS structure with a first layer wiring.

As in the case of the first embodiment, the third embodiment of the present invention can provide a semiconductor device capable of preventing the deterioration of device characteristics as much as possible and avoiding fluctuations in threshold voltage.

Further, as in the case of the first embodiment, it is possible to add the same additive element to the N- and P-type MIS transistors, and therefore a manufacturing process is simplified, thereby suppressing an increase in manufacturing costs.

Fourth Embodiment

Figure 13:
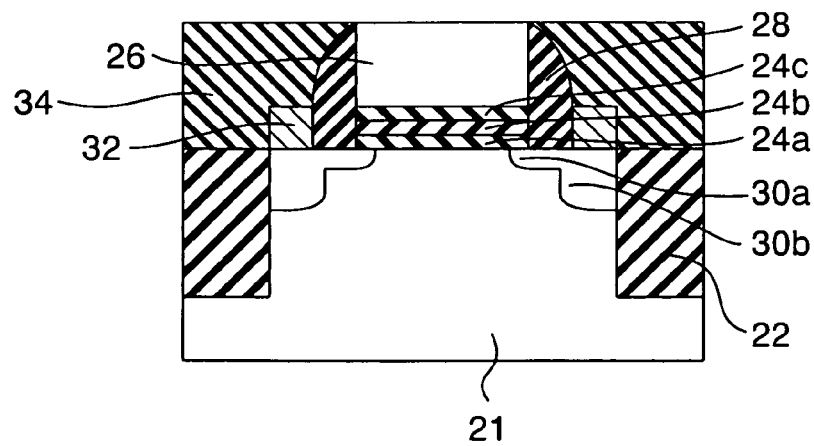
FIG. 13 is a cross-sectional view of a semiconductor device according to a fourth embodiment of the present invention.

Hereinbelow, a semiconductor device according to a fourth embodiment of the present invention will be described with reference to FIG. 13. The semiconductor device according to the fourth embodiment has the same structure as the semiconductor device according to the second embodiment shown in FIG. 7 except that the insulting film 24 is replaced with a gate insulating film 24 having a three-layer structure composed of an insulating film 24a of HfSiSbOx, an insulating film 24b of HfSiOx, and an insulating film 24c of HfSiSbOx.

Next, a manufacturing method of the semiconductor device according to the fourth embodiment will be described with reference to FIGS. 14A to 16C. FIGS. 14A to 16C are cross-sectional views which show the manufacturing steps of the semiconductor device according to the fourth embodiment.

First, an element isolation region 22 is formed on the semiconductor substrate 21. Here, as the semiconductor substrate 21, a p-type silicon substrate is used, and the element isolation region 22 is formed by a well-known method. Specifically, an STI trench (having a depth of, for example, about 0.4 μm) is formed in the substrate 21, and then a silicon oxide film is deposited on the entire surface of the substrate 21 by a CVD method to fill the trench with the silicon oxide film. Thereafter, the substrate 21 is subjected to CMP to obtain an element isolation region 22 shown in FIG. 14A.

Figure 14A:
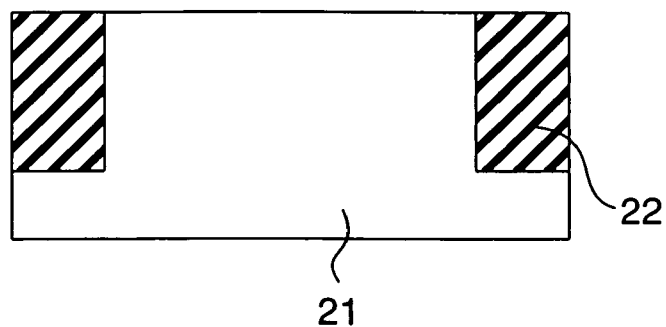
FIGS. 14A to 14C are cross-sectional views which show the manufacturing steps of the semiconductor device according to the fourth embodiment of the present invention.
Figure 14B:
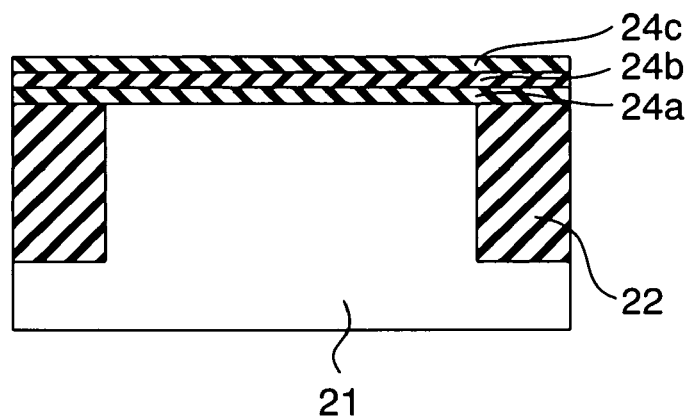

Next, boron (B) ions are implanted into an element region for threshold voltage adjustment. Thereafter, as shown in FIG. 14B, the insulating film 24a of HfSiSbOx is formed by a sputtering method. In this case, three targets, a hafnium target, a silicon target, and a antimony target to be added as an impurity are used, and the ratio of Hf to the sum of Hf and Si (Hf/(Hf+Si)) in the insulating film 24a and the amount of Sb to be contained as an impurity in the insulating film 24a are controlled by adjusting the ratio of power applied to these targets. In the fourth embodiment, the ratio, Hf/(Hf+Si) is set to 0.5, but can be set to any value within the range of 0.3 to 1.0. Further, the amount of Sb is set to 1.0 atomic %, but can be set to any value within the range of 0.003 to 3 atomic %. It is to be noted that the amount of Sb added as an impurity was evaluated by XPS. The insulating film 24a may be an oxynitride film or a nitride film obtained by controlling the amounts of nitrogen and oxygen to be mixed into an atmosphere for sputtering so that the insulating film 24a can contain nitrogen. In the fourth embodiment, the temperature of the substrate at the time when the insulating film 24a is formed is set to room temperature, but can be set to any value. Further, in the fourth embodiment, the thickness of the insulating film 24a of HfSiSbOx is set to 1 nm, but can be appropriately set to a value within the range of 0.5 nm to 1.5 nm.

Next, the insulating film 24b of HfSiOx is formed by sputtering in a state where no power is applied to the Sb target to stop sputtering from the Sb target. In the fourth embodiment, the thickness of the insulating film 24b made of HfSiOx is set to 2 nm, but can be appropriately set to a value within the range of 1 to 3 nm.

Then, the insulating film 24c of HfSiSbOx is formed on the insulating film 24b by sputtering in the same manner as in the case of the insulating film 24a. In the fourth embodiment, the ratio, Hf/(Hf+Si) is set to 0.5, but can be set to any value within the range of 0.3 to 1.0. Further, the amount of Sb is set to 1.0 atomic %, but can be set to any value within the range of 0.003 to 3 atomic %. As a matter of course, the amount of Sb contained in the insulting film 24c of HfSiSbOx may be different from the amount of Sb contained in the insulating film 24a of HfSiSbOx provided below the insulating film 24c as long as it is within the range of 0.003 to 3 atomic %.

A method for depositing the gate insulating film 24 is not limited to the method described above. For example, in a case where a CVD method is employed, the insulating films 24a and 24c of HfSiSbOx may be formed by, for example, feeding a source gas of the additive element, e.g., $SbCl_3$ gas only when the insulating films 24a and 24c are formed.

Figure 14C:
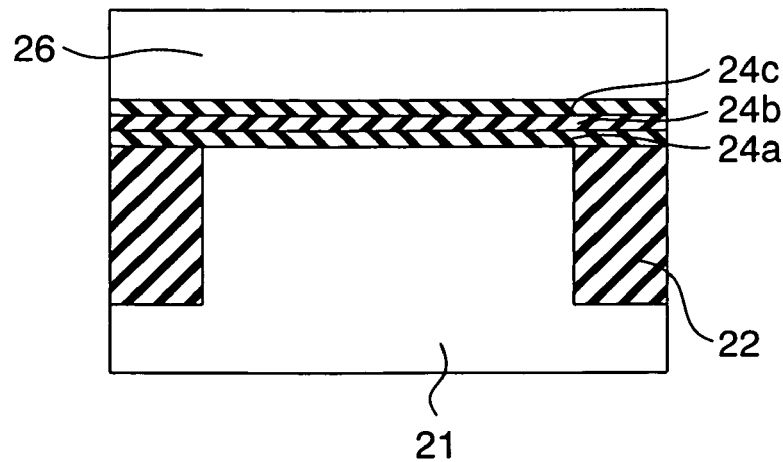

Next, as shown in FIG. 14C, a polycrystalline silicon film for forming the semiconductor gate electrode 26 is deposited on the gate insulating film 24 by a CVD method in an atmosphere containing $Si_2H_6$ or $SiH_4$.

Figure 15A:
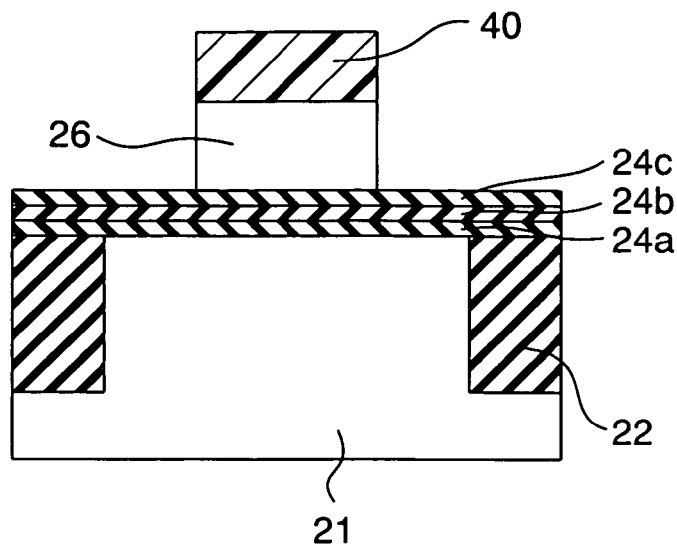
FIGS. 15A to 15C are cross-sectional views which show the manufacturing steps of the semiconductor device according to the fourth embodiment of the present invention.
Figure 15B:
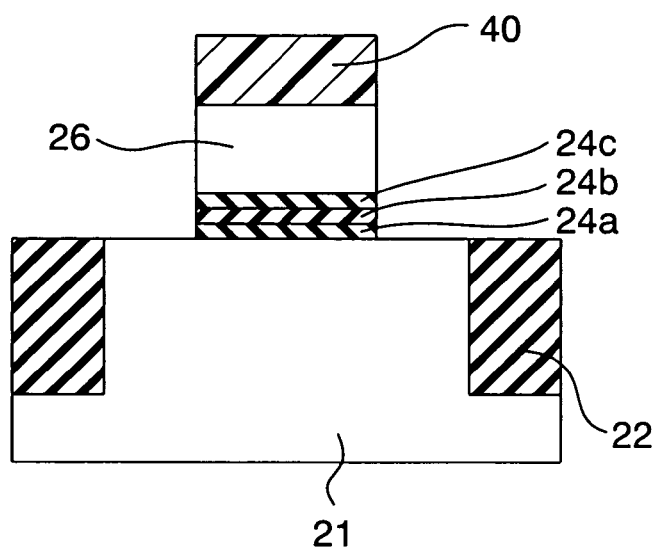

Next, a resist pattern 40 is formed on the polycrystalline silicon film, and then the polycrystalline silicon film is patterned using the resist pattern 40 as a mask by reactive ion etching using CFx gas to thereby form the gate electrode 26 shown in FIG. 15A. Then, in a state where the resist pattern 40 remains on the gate electrode 26, the insulating film 24 is etched using an aqueous hydrofluoric acid solution to form the gate insulting film 24 having a three-layer structure composed of the insulating films 24a, 24b and 24c as shown in FIG. 15B. As a result, the surface of the semiconductor substrate 21 is exposed on both sides of the gate insulating film 24.

Figure 15C:
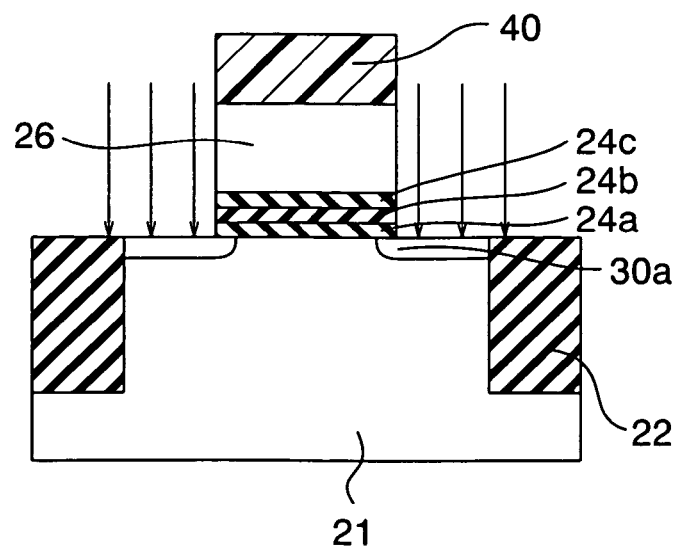

Next, as shown in FIG. 15C, arsenic ions are implanted into the exposed substrate 21 to form shallow impurity regions 30a. At this time, ion implantation is carried out at an accelerating voltage of 200 eV and a dosage of about $1\times10^{15}$ cm$^{-2}$.

Next, the resist pattern 40 is removed. Thereafter, $SiO_2$ or SiN is deposited on the entire surface by, for example, a CVD method, and then overall etching is carried out so that the gate side wall 28 having a thickness of 10 nm is formed on the side faces of the gate electrode 26 shown in FIG. 16A.

Figure 16A:
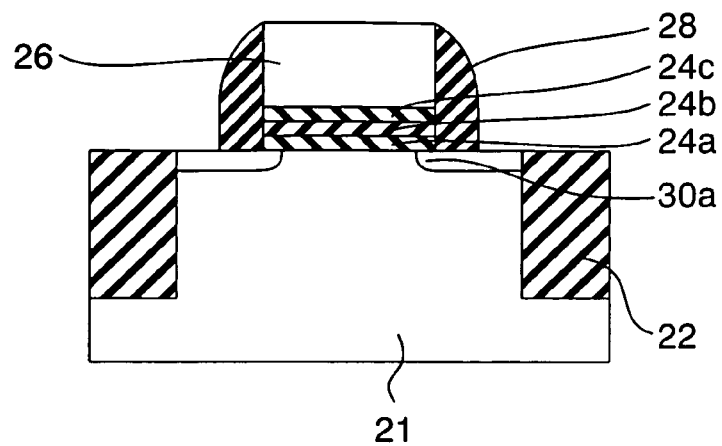
FIGS. 16A to 16C are cross-sectional views which show the manufacturing steps of the semiconductor device according to the fourth embodiment of the present invention.
Figure 16B:
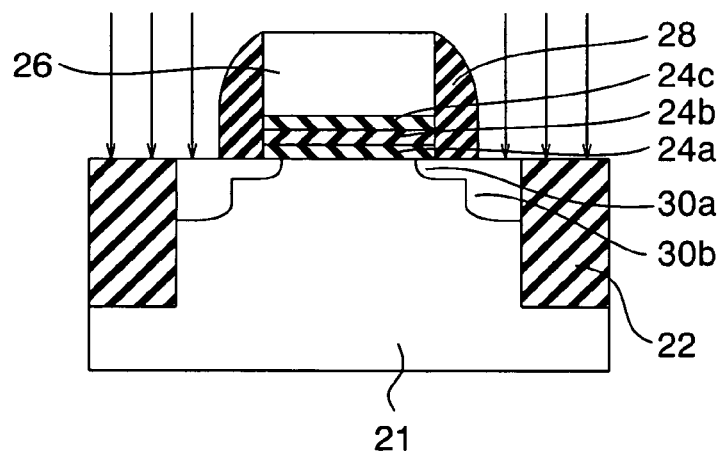

Arsenic ions are implanted into the substrate 21 by the use of the gate side wall 28 and the gate electrode 26 as a mask under the conditions of, for example, an accelerating voltage of 10 keV and a dosage of $1\times10^{15}$ cm$^{-2}$ to thereby form deep impurity regions 30b shown in FIG. 16B. Then, heat treatment is carried out at a temperature of 600° C. or higher for activation of the implanted impurity to thereby form extension layers 30a and source/drain regions 30b. Activation of the impurity is preferably carried out at a high temperature of about 1,000° C. for a short time of about 10 seconds.

Figure 16C:
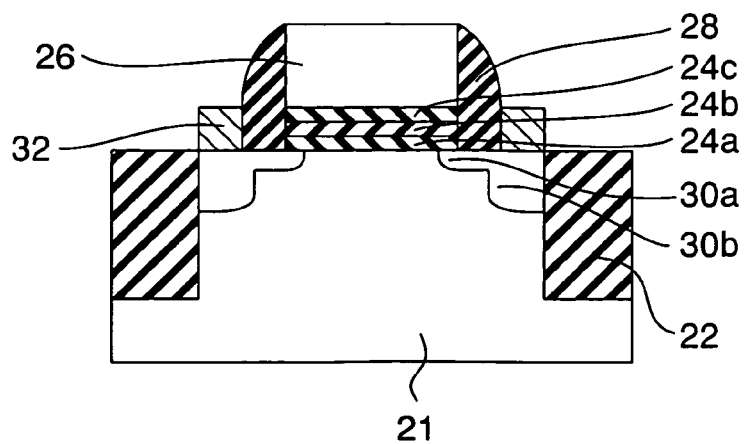

Next, a Ni film is formed on the entire surface, and is then subjected to heat treatment at a temperature of about 400° C. After the completion of heat treatment, unreacted Ni is removed by etching using a mixed solution of sulfuric acid and hydrogen peroxide. As a result, as shown in FIG. 16C, the Ni silicide (NiSi) layer 32 is formed on each of the source/drain regions 30b. At this time, although not shown in the drawing, the Ni silicide layer is formed also on the upper surface of the gate electrode 26 made of polycrystalline silicon. Thereafter, a silicon oxide film is deposited on the entire surface by a CVD method to form the interlayer insulating film 34 shown in FIG. 13.

Although subsequent steps are not shown in drawings, according to a well-known method, it is possible to obtain a MOS structure with a first layer wiring. For example, contact holes are formed in the interlayer insulating film 34 to expose the surface of the NiSi layer 32, and then TiN as a barrier metal is deposited on the bottom surfaces of the contact holes by CVD. Thereafter, W as a plug material is deposited on the entire surface to fill the contact holes with W, and then the entire surface is planarized by CMP. Then, an Al—Cu film as a wiring material is deposited, and the Al—Cu film is patterned by photolithography to thereby obtain a MOS structure with a first layer wiring.

As in the case of the first embodiment, the fourth embodiment of the present invention can provide a semiconductor device capable of preventing the deterioration of device characteristics as much as possible and avoiding fluctuations in threshold voltage.

Further, as in the case of the first embodiment, it is also possible to add the same additive element to the N- and P-type MIS transistors, and therefore a manufacturing process is simplified, thereby suppressing an increase in manufacturing costs.

Figure 17:
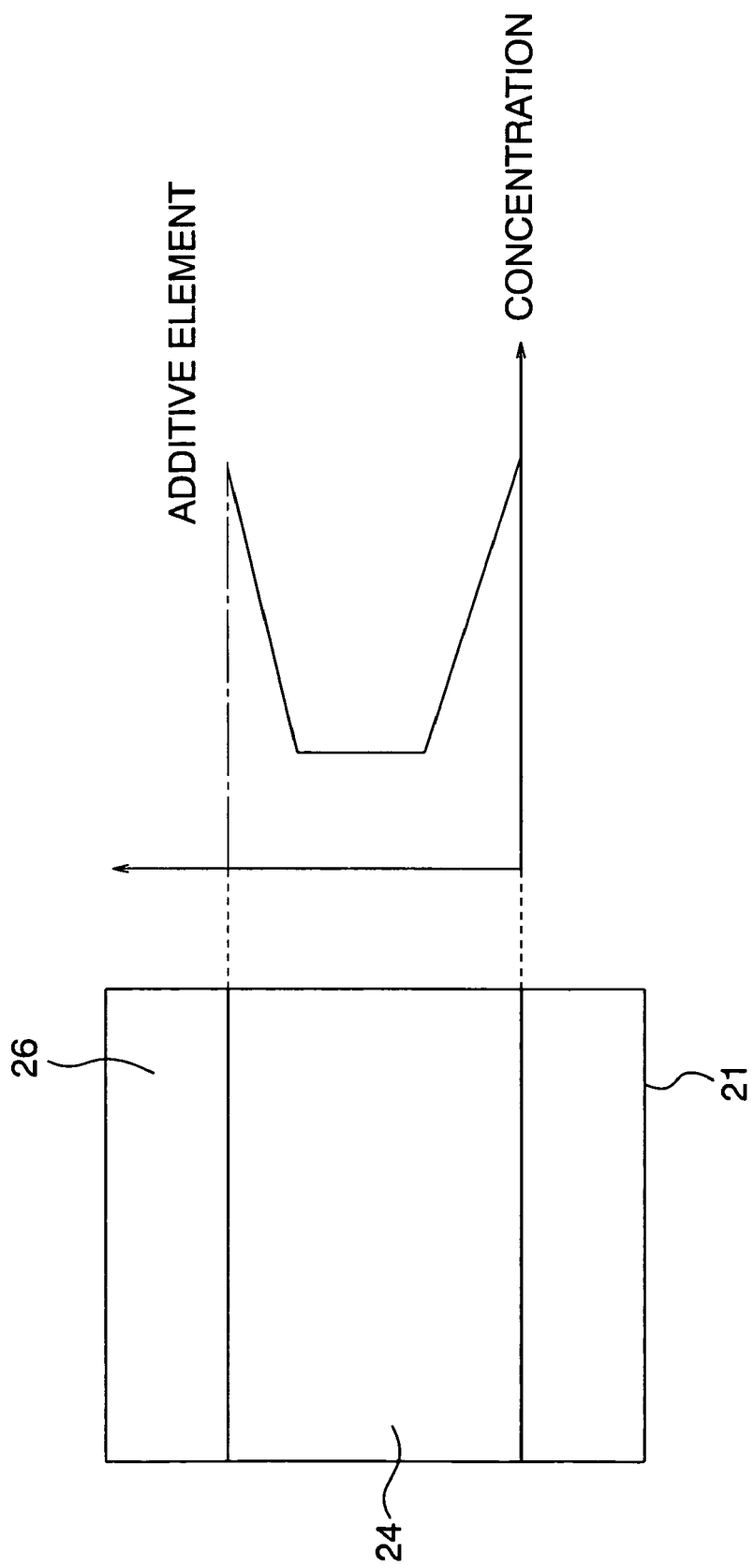
FIG. 17 is a cross-sectional view which shows the manufacturing step of the semiconductor device according to a modification of the fourth embodiment of the present invention.

The gate insulating film 24 does not necessarily need to have a three-layer structure as shown in the fourth embodiment as long as the concentration of the additive element is high in the vicinity of the interface between the semiconductor substrate and the gate insulating film or in the vicinity of the interface between the gate electrode and the gate insulating film. For example, as shown in FIG. 17, the gate insulating film 24 may be formed in such a manner that the concentration of the additive element added to the gate insulating film 24 formed from a high-dielectric constant metal oxide film is increased from the middle part of the gate insulating film 24 toward both of the interface between the gate insulating film and the gate electrode and the interface between the semiconductor substrate and the gate insulating film. Alternatively, the gate insulating film 24 may be formed in such a manner that the concentration of the additive element added to the gate insulating film 24 is increased from the middle part of the gate insulating film 24 toward at least one of the interface between the gate insulating film and the gate electrode and the interface between the semiconductor substrate and the gate insulating film. It is to be noted that FIG. 17 shows a case where the concentration of the additive element is linearly increased from the middle part of the gate insulating film toward the interface between the gate insulating film and the gate electrode and the interface between the semiconductor substrate and the gate insulating film, but the gate insulating film 24 may be alternatively formed in such a manner that the concentration of the additive element is increased stepwise. In this case, after the gate insulating film 24 is formed in such a manner that the concentration of the additive element is increased stepwise, the gate insulating film 24 may further be subjected to heat treatment at a temperature of about 600° C. to diffuse the additive element toward the middle part of the gate insulating film 24.

As shown in the fourth embodiment, by forming the gate insulating film in such a manner that the concentration of the additive element becomes high in the vicinity of the interface between the semiconductor substrate and the gate insulating film or in the vicinity of the interface between the gate electrode and the gate insulating film, it is possible to effectively compensate for oxygen vacancies likely to be generated in the vicinity of the electrode or semiconductor substrate and to suppress an increase in gate leakage current or an increase in fixed charge.

Various modifications can be made to the second, third, and fourth embodiments described above. For example, although antimony (Sb) is used as the additive element in these embodiments, the additive element may alternatively be another element of Group 15 such as phosphorus (P), arsenic (As) or bismuth (Bi), or an element of Group 16 such as sulfur (S), selenium (Se) or tellurium (Te), or an element of Group 5 such as vanadium (V), niobium (Nb) or tantalum (Ta), or an element of Group 6 such as chromium (Cr), molybdenum (Mo) or tungsten (W). In a case where any of Sb, P, As and Bi is used as the additive element, the concentration of the additive element is preferably 0.1 atomic % or more but 3 atomic % or less. By setting the concentration of such an additive element to a value within the above range, it is possible to effectively compensate for oxygen vacancies, generated in the step of forming the gate electrode or the step of heat treatment for activation, with the additive element diffused in the gate insulating film. In a case where any of S, Se, Te, V, Nb, Ta, Cr, Mo and W is used as the additive element, the concentration of the additive element is preferably 0.003 atomic % or more but 3 atomic % or less. By setting the concentration of such an additive element to a value within the above range, it is possible to effectively compensate for oxygen vacancies generated in the step of forming the gate electrode or the step of heat treatment for activation. It is to be noted that the additive element is not limited to one kind of element, and two or more kinds of additive elements may be added simultaneously. In this case, as described above with reference to the first embodiment, the total concentration of the additive elements is preferably 3 atomic % or less.

Further, the silicide layer 32 formed on the source/drain regions 30b may be formed using $CoSi_2$ or $TiSi_2$ instead of NiSi.

Furthermore, SiGe may be used as the gate electrode. SiGe can be formed by, for example, mixing $SiH_4$ gas or $Si_2H_6$ gas with a gas containing Ge, such as $Ge_2H_6$ gas. Alternatively, silicide and/or germanide may be used as the gate electrode. Examples of silicide include $WSi_2$, NiSi, $CoSi_2$, $PtSi$, and $MoSi_2$. Examples of germanide include $WGe_2$, NiGe, $NiGe_2$, $CoGe_2$, PtGe, and $MoGe_2$. A lanthanoide series metal silicide or germanide may also be used as the gate electrode.

Moreover, the gate insulating film 24 may be a film made of $HfO_2$, a film made of a mixture of $HfO_2$ and aluminum oxide, a film made of $ZrO_2$, a film made of a mixture of $ZrO_2$ and silicon oxide, a film made of a mixture of $ZrO_2$ and $Al_2O_3$, a film made of $TiO_2$, a film made of a mixture of $TiO_2$ and silicon oxide, or a film made of a mixture of $TiO_2$ and $Al_2O_3$. Alternatively, the gate insulating film 24 may be made of a lanthanoide series metal oxide typified by $La_2O_3$, a mixture of such a lanthanoide series metal oxide and $SiO_2$, or a mixture of oxide of a lanthanoide series metal such as La, Ce, Pr, Nd, Pm, Sm, Eu, Gd, Tb, Dy, Ho, Er, Tm, Yb or Lu and $Al_2O_3$.

Moreover, the gate insulating film 24 may be formed by MOCVD, halide CVD or atomic layer deposition. Since an increase in leakage current is caused by phase separation or crystallization which occurs in the film due to, for example, heat treatment for activation of the electrode, the gate insulating film is preferably nitrided. For example, the gate insulating film can be nitrided by CVD in an atmosphere containing $NH_3$ or N. For example, in the case of Hf, nitriding can be carried out by CVD using $Hf(N(C_2H_5)_2)_4$. The metal contained in the metal oxide can be changed by selecting a precursor containing the metal and nitrogen. Alternatively, nitrogen activated by plasma may be added to an atmosphere or a formed film may be exposed to N plasma. In the case of CVD, the additive element can be added by feeding a source gas of the additive element such as $SbCl_3$ together with other gases. A method for adding the additive element is not limited to the method described above. For example, the additive element can be added by ion implantation carried out after the gate insulating film is deposited.

Figure 18:
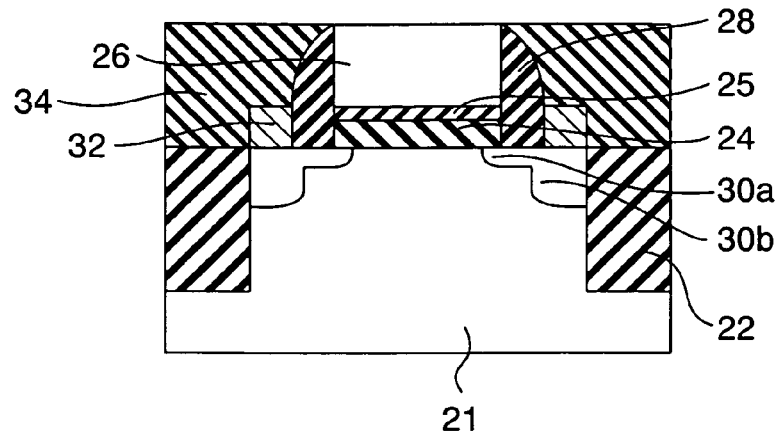
FIG. 18 is a cross-sectional view of a semiconductor device according to a modification of any one of the first to fourth embodiments of the present invention.

It is to be noted that as shown in FIG. 18, an insulating film 25 made of silicon oxide or silicon oxynitride may be provided between the gate insulating film 24 and the gate electrode 26 to prevent oxygen (O) from penetrating into the gate electrode. However, the thickness of the insulating film 25 is preferably 2 nm or less to prevent an increase in leakage current caused by decrease in dielectric constant.

Figure 19:
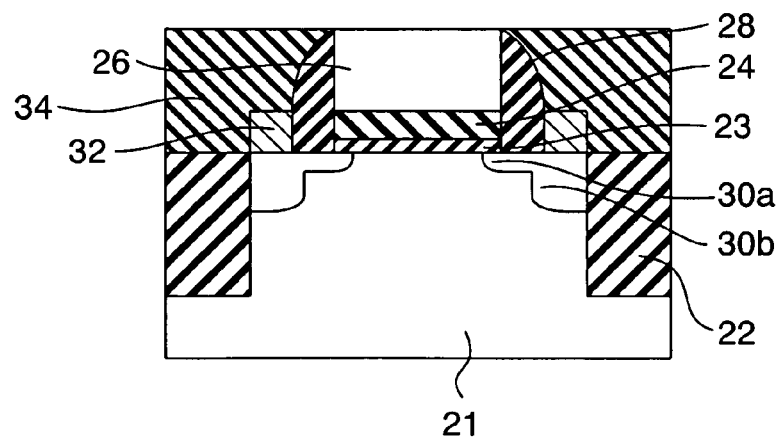
FIG. 19 is a cross-sectional view of a semiconductor device according to a modification of any one of the first to fourth embodiments of the present invention.

Further, as shown in FIG. 19, an insulating film 23 made of silicon oxide or silicon oxynitride may be provided between the gate insulating film 24 and the semiconductor substrate 21 to prevent oxygen (O) from penetrating into the semiconductor substrate. However, the thickness of the insulating film 23 is preferably 2 nm or less to prevent an increase in leakage current caused by decrease in dielectric constant.

In each of the second, third, and fourth embodiments, the MIS transistor directly formed on the Si substrate has been described by way of example, but the present invention is not limited to such a structure. The present invention can also be applied to SOI (Silicon On Insulator) structures, vertical MIS transistors in which current flows in a direction perpendicular to a substrate, and vertical MIS transistors in which current flows in the side face of an Si pillar.

Further, also in a case where a substrate made of Ge, SiGe, strained Si or strained Ge is used instead of the silicon substrate, the same effects as described above can be obtained.

Fifth Embodiment

Hereinbelow, a semiconductor device according to a fifth embodiment of the present invention will be described with reference to FIGS. 20 to 24B.

Figure 20:
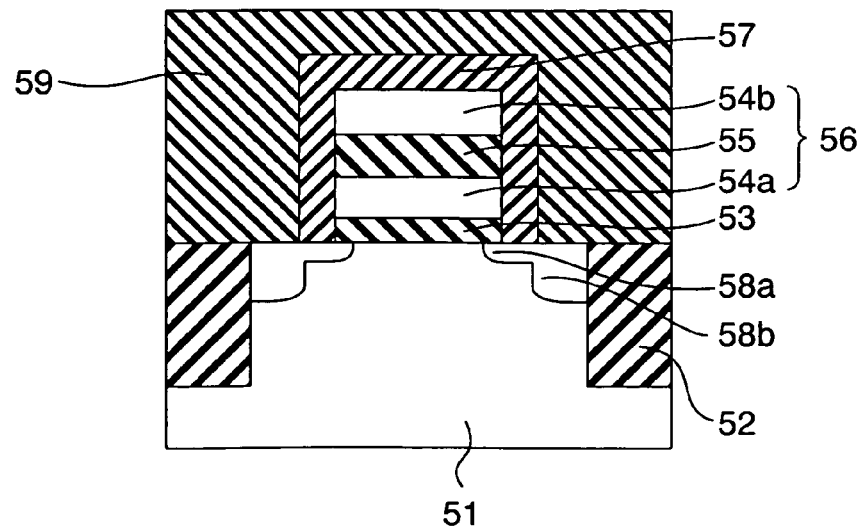
FIG. 20 is a cross-sectional view of a semiconductor device according to a modification of a fifth embodiment of the present invention.

The semiconductor device according to the fifth embodiment is a nonvolatile semiconductor memory device. FIG. 20 is a cross-sectional view of the semiconductor device according to the fifth embodiment. A silicon oxide film 52 is provided on a p-type silicon substrate 51 for element isolation. In the silicon substrate 51, shallow diffusion layers 58a and deep diffusion layers 58b are provided as n-type source and drain by arsenic ion implantation. On the surface of the silicon substrate 51, a tunnel oxide film 53 made of oxynitride containing silicon, oxygen and nitrogen as main components is provided. On the tunnel oxide film 53, a floating gate electrode 54a made of polycrystalline silicon is provided. On the floating gate electrode 54a, an interelectrode insulating film 55 made of hafnium oxide (HfSiSbOx) is provided so as to have a thickness of 15 nm. On the interelectrode insulating film 55, a control gate electrode 54b made of polycrystalline silicon is provided. The floating gate electrode 54a, the interelectrode insulating film 55, and the control gate electrode 54b constitute a gate part 56. On the side and top surfaces of the gate part 56 composed of the floating gate electrode 54a, the interelectrode insulating film 55, and the control gate electrode 54b, an insulating film 57 made of silicon oxide is provided. The insulating film 57 and the source and drain regions 58b are covered with an interlayer insulating film 59 made of silicon oxide. In the interlayer insulating film 59, holes (not shown in the drawing) for making contact with the source and drain regions 58b and the control gate electrode 54b are provided, and these holes are filled with Al electrodes (not shown in the drawing).

Next, a method for manufacturing the nonvolatile semiconductor memory device according to the fifth embodiment will be described with reference to FIGS. 21A to 24B.

Figure 21A:
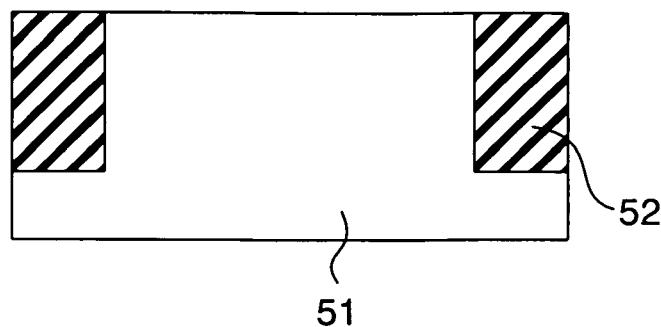
FIGS. 21A to 21C are cross-sectional views which show the manufacturing steps of the semiconductor device according to the fifth embodiment of the present invention.

First, as shown in FIG. 21A, the element isolation region 52 is formed on the semiconductor substrate 51. Here, a p-type Si substrate is used as the semiconductor substrate 51, and the element isolation region 52 is formed according to a well-known method. Specifically, an STI trench (having a depth of, for example, about 0.4 μm) is formed in the substrate 51, and then a silicon oxide film is deposited on the entire surface of the substrate 51 by a CVD method to fill the trench with the silicon oxide film. Thereafter, the substrate 51 is subjected to CMP to obtain an element isolation region 52 shown in FIG. 21A.

Figure 21B:
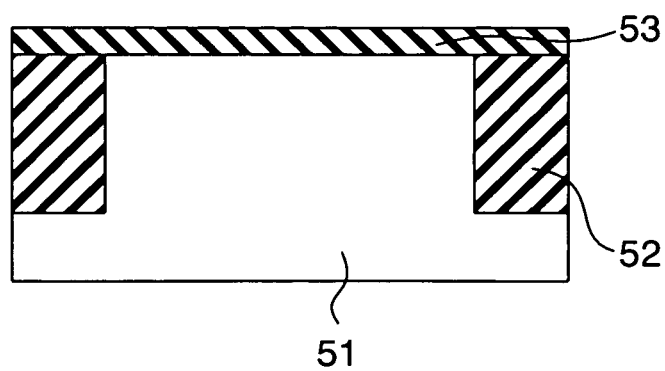

Next, as shown in FIG. 21B, a silicon oxide film is formed by, for example, thermal oxidation using dry oxygen so as to have a thickness of 7 nm, and then the silicon oxide film is exposed to, for example, an atmosphere of ammonia ($NH_3$) gas for introduction of a nitrogen atom, to thereby form the tunnel oxide film (i.e., a gate insulating film) 53 made of oxynitride.

Figure 21C:
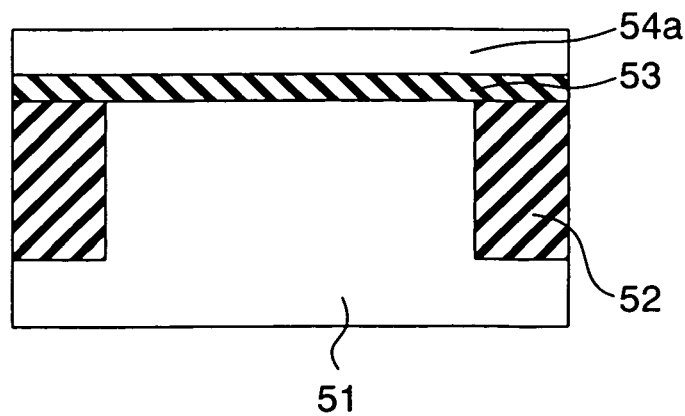

Then, as shown in FIG. 21C, the n-type polycrystalline silicon film 54a containing phosphorus is deposited on the tunnel oxide film 53 so as to have a thickness of 200 nm.

Figure 22A:
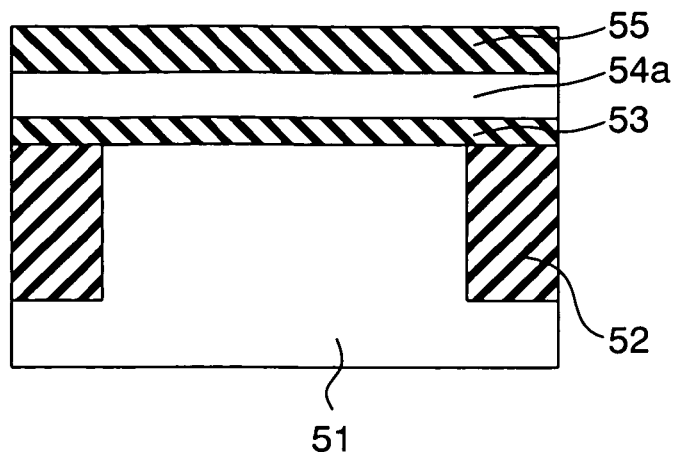
FIGS. 22A to 22C are cross-sectional views which show the manufacturing steps of the semiconductor device according to the fifth embodiment of the present invention.

Next, as shown in FIG. 22A, on the polycrystalline silicon film 54a, the interelectrode insulating film 55 made of, for example, hafnium oxide containing antimony (Sb) as an impurity (HfSiSbOx) is formed by a sputtering method so as to have a thickness of 15 nm. The interelectrode insulating film 55 made of HfSiSbOx is formed using three targets, an Hf target, an Si target, and a target of Sb to be added as an impurity, and the ratio of Hf to the sum of Hf and Si (Hf/(Hf+Si)) in the interelectrode insulating film 55 of HfSiSbOx and the amount of Sb to be contained as an impurity in the HfSiSbOx film are controlled by adjusting the ratio of power applied to these targets. In the fifth embodiment, the ratio, Hf/(Hf+Si) is set to 0.5, but can be set to any value within the range of 0.3 to 1.0. Further, the amount of Sb is set to 1.0 atomic %, but can be set to any value within the range of 0.003 to 3 atomic %.

Figure 22B:
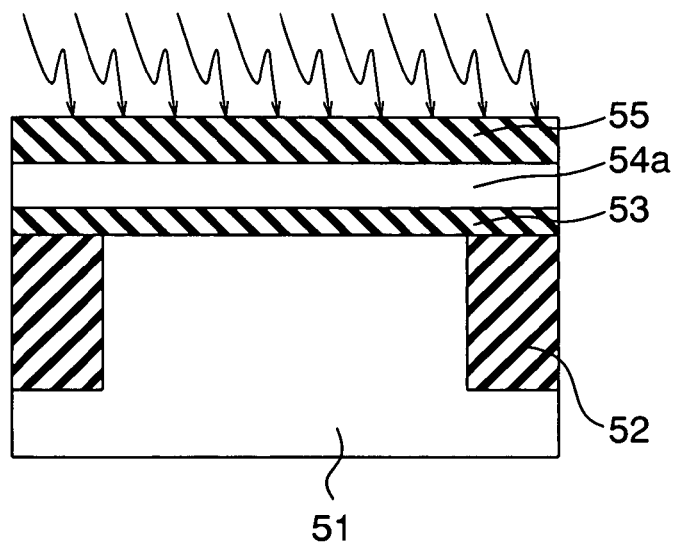

Then, as shown in FIG. 22B, heat treatment is carried out using dry oxygen at a temperature of 650° C. At this time, atomic oxygen introduced into the interelectrode insulating film fills vacancies of, for example, oxygen and helps Sb atoms that have not been introduced into the interelectrode insulating film formed by sputtering to be efficiently introduced into oxygen vacancy sites or hafnium vacancy sites.

Figure 22C:
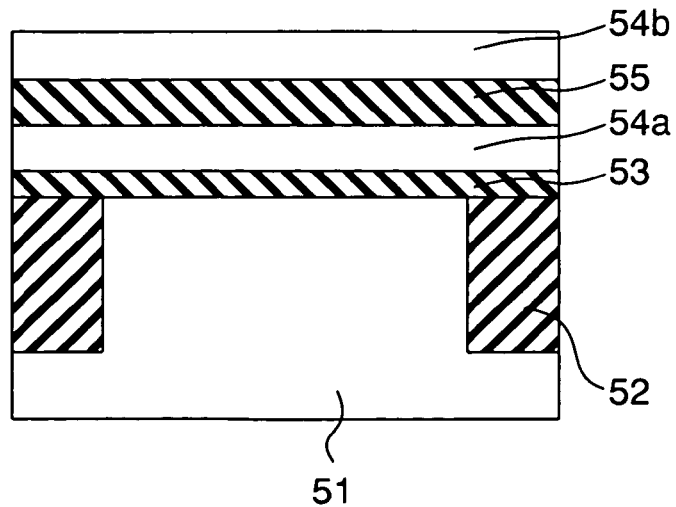

Next, as shown in FIG. 22C, the n-type polycrystalline silicon film 54b containing phosphorus is deposited on the interelectrode insulating film 55 so as to have a thickness of 200 nm.

Figure 23A:
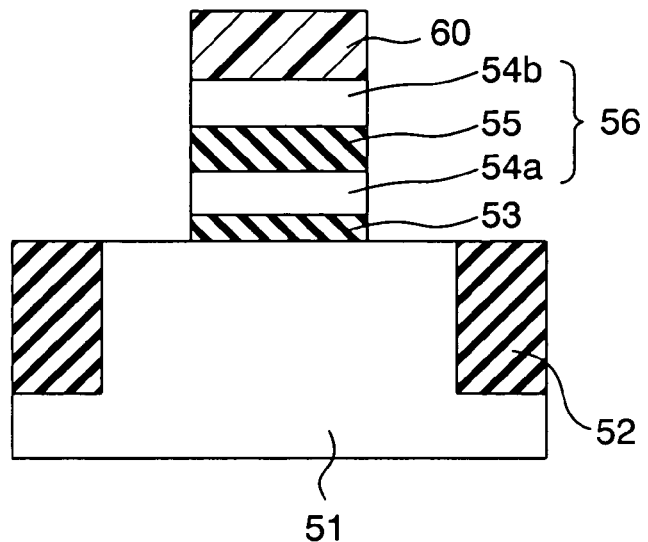
FIGS. 23A to 23B are cross-sectional views which show the manufacturing steps of the semiconductor device according to the fifth embodiment of the present invention.

Next, as shown in FIG. 23A, a resist pattern 60 is formed on the n-type polycrystalline silicon film 54b, and then the polycrystalline silicon film 54b, the interelectrode insulating film 55, the polycrystalline silicon film 54a, and the tunnel oxide film 53 are patterned by a reactive ion etching method using the resist pattern 60 as a mask to thereby form the gate part 56 and the gate insulating film 53. As a result, the surface of the semiconductor substrate 51 is exposed on both sides of the gate part 56.

Figure 23B:
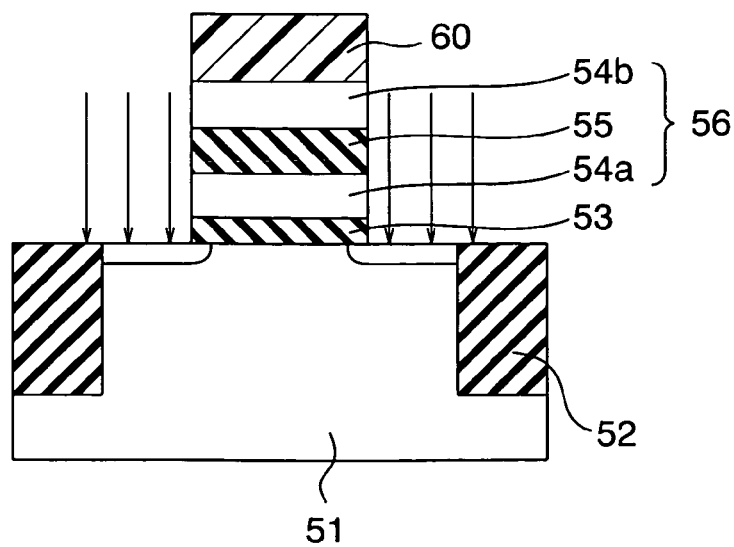

Then, as shown in FIG. 23B, arsenic ions are implanted into an element region of the exposed substrate 51 at 200 eV at a dosage of about $1 \times 10^{15}$ cm$^{-2}$ to form shallow impurity regions 58a. Thereafter, the resist pattern is removed.

Figure 24A:
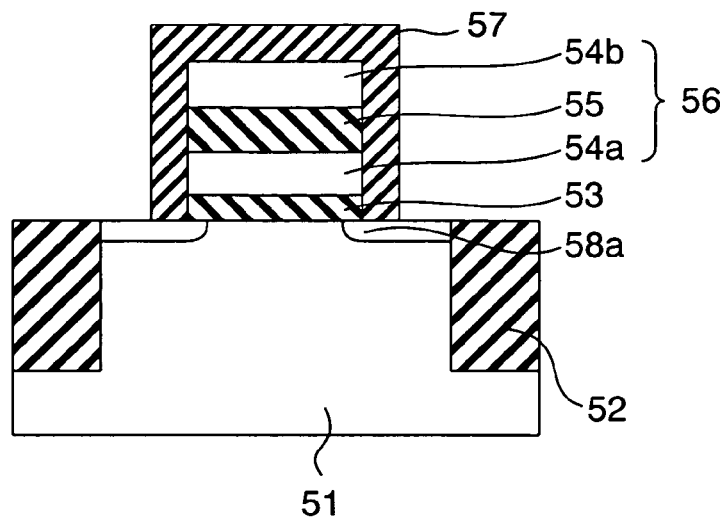
FIGS. 24A to 24B are cross-sectional views which show the manufacturing steps of the semiconductor device according to the fifth embodiment of the present invention.

Next, as shown in FIG. 24A, heat treatment is carried out in an oxidative atmosphere for the purpose of, for example, recovery from damage resulting from processing so that the oxide film 57 having a thickness of about 3 nm is formed so as to cover the side and top surfaces of the gate part 56.

Figure 24B:
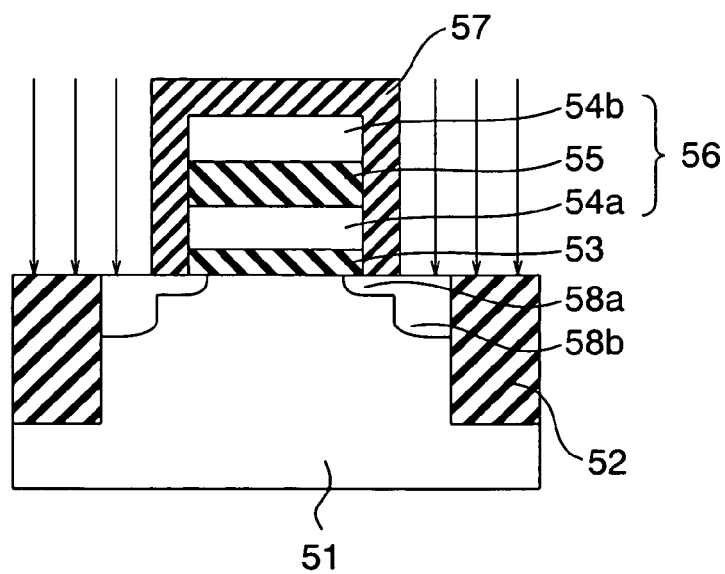

Next, as shown in FIG. 24B, ions of, for example, phosphorus are implanted into the entire surface at a dosage of $3 \times 10^{15}$ cm$^{-2}$. The implanted phosphorus ions are distributed around a peak depth dependent upon the acceleration energy in the silicon substrate 51. Thereafter, phosphorus is diffused in the silicon substrate 51 and activated by, for example, carrying out heat treatment at 1,000° C. for 20 seconds to thereby form the diffusion layers 58b as source/drain regions. Then, a silicon oxide film having a thickness of 300 nm is deposited on the entire surface by a CVD method to form the interlayer insulating film 59 shown in FIG. 20.

Although subsequent steps are not shown in drawings, according to a well-known method, it is possible to obtain a MOS structure with a first layer wiring. For example, contact holes are formed in the interlayer insulating film 59 to expose the surface of the source/drain regions 58b, and then TiN as a barrier metal is deposited on the bottom surfaces of the contact holes by CVD. Thereafter, W as a plug material is deposited on the entire surface to fill the contact holes with W, and then the entire surface is planarized by CMP. Then, an Al—Cu film as a wiring material is deposited, and the Al—Cu film is patterned by photolithography to thereby obtain a MOS structure with a first layer wiring.

According to the fifth embodiment, since the interelectrode insulating film 55 provided between the floating gate electrode 54a and the control gate electrode 54b is made of hafnium oxide containing antimony at 1 atomic %, it is possible to compensate for vacancies of, for example, oxygen, thereby making it possible to provide a nonvolatile semiconductor memory device with a low leakage current.

As has been described above, according to the fifth embodiment, it is possible to prevent the deterioration of device characteristics as much as possible.

Various modifications can be made to the fifth embodiment described above. For example, although antimony (Sb) is used as the additive element in the fifth embodiment, the additive element may alternatively be another element of Group 15 such as phosphorus, arsenic or bismuth, or an element of Group 16 such as sulfur, selenium or tellurium, or an element of Group 5 such as vanadium, niobium or tantalum, or an element of Group 6 such as chromium, molybdenum or tungsten. In a case where any of Sb, P, As and Bi is used as the additive element, the concentration of the additive element is preferably 0.1 atomic % or more but 3 atomic % or less. By setting the concentration of such an additive element to a value within the above range, it is possible to effectively compensate for oxygen vacancies, generated in the step of forming the gate electrode or the step of heat treatment for activation, with the additive element diffused in the interelectrode insulating film. In a case where any of S, Se, Te, V, Nb, Ta, Cr, Mo and W is used as the additive element, the concentration of such an additive element is preferably 0.003 atomic % or more but 3 atomic % or less. By setting the concentration of such an additive element to a value within the above range, it is possible to effectively compensate for oxygen vacancies generated in the step of forming the gate electrode or the step of heat treatment for activation. It is to be noted that the additive element is not limited to one kind of element, and two or more kinds of additive elements may be added simultaneously. In this case, as described above with reference to the first embodiment, the total concentration of the additive elements is preferably 3 atomic % or less.

Further, SiGe may be used as the floating gate electrode 54a and the control gate electrode 54b. SiGe can be formed by, for example, mixing $SiH_4$ gas or $Si_2H_6$ gas with a gas containing Ge such as $Ge_2H_6$ gas. Alternatively, silicide and/or germanide may be used as the floating gate electrode 54a and the control gate electrode 54b. Examples of silicide include $WSi_2$, NiSi, $CoSi_2$, PtSi, and $MoSi_2$. Examples of germanide include $WGe_2$, NiGe, $NiGe_2$, $CoGe_2$, PtGe, and $MoGe_2$. A lanthanoide series metal silicide or germanide may also be used as the floating gate electrode 54a and the control gate electrode 54b.

Furthermore, the interelectrode insulating film 55 may be a film made of $HfO_2$, a film made of a mixture of $HfO_2$ and aluminum oxide, a film made of $ZrO_2$, a film made of a mixture of $ZrO_2$ and silicon oxide, a film made of a mixture of $ZrO_2$ and $Al_2O_3$, a film made of $TiO_2$, a film made of a mixture of $TiO_2$ and silicon oxide, or a film made of a mixture of $TiO_2$ and $Al_2O_3$. Alternatively, the interelectrode insulating film 55 may be made of a lanthanoide series metal oxide typified by $La_2O_3$, a mixture of such a lanthanoide series metal oxide and $SiO_2$, an oxide of a lanthanoide series metal such as La, Ce, Pr, Nd, Pm, Sm, Eu, Gd, Tb, Dy, Ho, Er, Tm, Yb or Lu, or a mixture of such a lanthanoide series metal oxide and $Al_2O_3$.

Moreover, the interelectrode insulating film 55 may be formed by MOCVD, halide CVD or atomic layer deposition. Since an increase in leakage current is caused by phase separation or crystallization which occurs in the film due to, for example, heat treatment for activation of the electrode, the insulating film 55 is preferably nitrided. For example, the insulating film can be nitrided by CVD in an atmosphere containing $NH_3$ or N. For example, in the case of Hf, nitriding can be carried out by CVD using $Hf(N(C_2H_5)_2)_4$. The metal contained in the metal oxide can be changed by selecting a precursor containing the metal and nitrogen. Alternatively, nitrogen activated by plasma may be contained in an atmosphere or a formed film may be exposed to N plasma. In the case of CVD, the additive element can be added by feeding a source gas of the additive element such as $SbCl_3$ together with other gases. A method for adding the additive element is not limited to the method described above. For example, the additive element can be added by ion implantation carried out after the interelectrode insulating film is deposited.

As in the case of the semiconductor device described with reference to FIG. 18, an Si oxide film or an Si oxynitride film may be provided between the interelectrode insulating film 55 and the floating gate electrode 54a or between the interelectrode insulating film 55 and the control gate electrode 54b. However, the thickness of the Si oxide film or the Si oxynitride film is preferably 2 nm or less to prevent an increase in leakage current caused by decrease in dielectric constant.

Further, Ge, SiGe, strained Si or strained Ge can be used as the semiconductor substrate 51. Also in this case, it is possible to manufacture a nonvolatile semiconductor memory device having the same effects as obtained by the fifth embodiment.

As has been described above, according to each of the embodiments of the present invention, it is possible to prevent the deterioration of device characteristic as much as possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
   a semiconductor substrate;
   a gate insulating film provided above the semiconductor substrate and containing a metal, oxygen and an additive element;
   a gate electrode provided above the gate insulating film; and
   source/drain regions provided in the semiconductor substrate on both sides of the gate electrode,
   the additive element being at least one element selected from the group consisting of vanadium, chromium, molybdenum, tungsten, bismuth, sulfur, selenium, and tellurium at a concentration of 0.003 atomic % or more but 3 atomic % or less.

2. The semiconductor device according to claim 1, wherein the additive element is bismuth at a concentration of 0.1 atomic % or more but 3 atomic % or less.

3. The semiconductor device according to claim 1, wherein the gate insulating film contains bonding between the metal and the additive element.

4. The semiconductor device according to claim 1, wherein the gate insulating film contains bonding between the oxygen and the additive element.

5. The semiconductor device according to claim 1, further comprising an insulating film made of Si oxide or Si oxynitride and provided either between the gate insulating film and the gate electrode or between the gate insulating film and the semiconductor substrate.

6. The semiconductor device according to claim 1, wherein the metal is at least one element selected from the group consisting of Hf, Zr, Ti, and lanthanoide series elements.

* * * * *